(12) United States Patent
Furukawa et al.

(10) Patent No.: US 6,583,462 B1
(45) Date of Patent: Jun. 24, 2003

(54) VERTICAL DRAM HAVING METALLIC NODE CONDUCTOR

(75) Inventors: Toshiharu Furukawa, Essex Junction, VT (US); Rajarao Jammy, Wappingers Falls, NY (US); Thomas Kanarsky, Hopewell Junction, NY (US); Jeffrey John Welser, Stamford, CT (US); David Vaclav Horak, Essex Junction, VT (US); Steven John Holmes, Milton, VT (US); Mark Charles Hakey, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/702,338

(22) Filed: Oct. 31, 2000

(51) Int. Cl.⁷ .................. H01L 27/108; H01L 29/76; H01L 29/94; H01L 31/119
(52) U.S. Cl. .................. 257/305; 257/302; 257/304
(58) Field of Search ............... 257/301, 302, 257/304, 305; 438/239, 242, 243, 268, 270

(56) References Cited

U.S. PATENT DOCUMENTS

| | | | |
|---|---|---|---|
| 4,803,535 A | 2/1989 | Taguchi | 257/301 |
| 5,216,266 A | 6/1993 | Ozaki | 257/302 |
| 5,442,211 A | 8/1995 | Kita | 257/301 |
| 5,528,062 A | 6/1996 | Hsieh et al. | 257/298 |
| 5,594,682 A | 1/1997 | Lu et al. | 365/149 |
| 5,701,022 A | 12/1997 | Kellner et al. | 257/300 |
| 5,723,889 A | 3/1998 | Choi et al. | 257/329 |
| 5,770,876 A | 6/1998 | Lam et al. | 257/301 |
| 5,793,077 A | 8/1998 | Tseng | 257/301 |
| 5,831,301 A | * 11/1998 | Horak et al. | 257/302 |
| 5,905,279 A | 5/1999 | Nitayama et al. | 257/301 |
| 5,913,125 A | 6/1999 | Brouillette et al. | 438/386 |
| 5,939,745 A | 8/1999 | Park et al. | 257/304 |
| 6,020,609 A | 2/2000 | Wu | 257/309 |

* cited by examiner

Primary Examiner—Olik Chaudhuri
Assistant Examiner—Theresa T. Doan
(74) Attorney, Agent, or Firm—Joseph P. Abate

(57) ABSTRACT

A dynamic random access memory device formed in a substrate having a trench. The trench has a side wall, a top, a lower portion, and a circumference. The device includes a signal storage node including a metallic storage node conductor formed in the lower portion of the trench and isolated from the side wall by a node dielectric and a collar oxide above the node dielectric. Preferably, the trench has an aspect ratio of greater than 50. A buried strap is coupled to the storage node conductor and contacts a portion of the side wall of the trench above the collar oxide. A trench-top dielectric which is formed upon the buried strap has a trench-top dielectric thickness. A signal transfer device includes a first diffusion region extending into the substrate adjacent the portion of the trench side wall contacted by the buried strap, a gate insulator having a gate insulator thickness formed on the trench side wall above the first buried strap, wherein the gate insulator thickness is less than the trench-top dielectric thickness, and a gate conductor formed within the trench upon the trench-top dielectric and adjacent the gate insulator.

11 Claims, 25 Drawing Sheets

VERTICAL DRAM HAVING METALLIC NODE CONDUCTOR

TECHNICAL FIELD

The present invention relates generally to a dynamic random access memory (DRAM) device and, more particularly, to a vertical DRAM device having robust gate-to-storage node isolation.

BACKGROUND OF THE INVENTION

In the semiconductor industry, there is an ever-increasing desire to increase memory density and performance. These goals are often achieved by scaling dynamic random access memory (DRAM) devices to smaller dimensions and operating voltages.

A DRAM cell may include a horizontal, planar, MOSFET (metal oxide semiconductor field effect transistor) transfer device coupled to a deep trench storage capacitor by a buried strap. As the size of such a DRAM cell is scaled to increase memory density, scaling of the channel length of the transfer device may be limited to prevent degradation of sub-threshold leakage requirements (or retention time requirements).

Vertical memory devices, which use a trench to form both a signal storage node and a signal transfer device, have been proposed to increase memory density. Vertical memory devices may have degrading performance because of reduced storage capacitance, when a nitride is used as a node dielectric material in a vertical memory device having very small dimensions—eg, below 0.12 micron design trench DRAM.

Also, heavily doped polysilicon which has been used for a node conductor does not operate satisfactorily in below 0.12 micron design trench DRAMS, because of, eg, its high electrical resistance and the carrier depletion from the doped polysilicon.

To overcome the shortcomings of conventional DRAM devices, a new DRAM device is provided. A principal object of the present invention is to provide a DRAM device that has improved charge retention characteristics—while retaining a nitride as the node dielectric.

A related object is to provide a process of manufacturing such a DRAM device.

Another subject is to provide a process of manufacturing such a DRAM device which is compatible with manufacturing support circuitry.

SUMMARY OF THE INVENTION

To achieve these and other objects, the present invention provides a dynamic random access memory device formed in a substrate having a trench. The trench has a side wall, a top, a lower portion, and a circumference. The device includes a signal storage node including a storage node conductor formed in the lower portion of the trench and isolated from the side wall by a node dielectric and a collar oxide above the node dielectric. The storage node conductor comprises a metal or a metal alloy such as tungsten, WN, TiN or a metal silicide. Preferably, the DRAM device has a width dimension (W) of less than 0.12 microns, and an aspect ratio (D/W) of greater than 50.

The various features of the drawing figures are not to scale, to provide greater clarity.

FIGS. 1A–C illustrate processes for forming a known trench-top dielectric;

Figure 4:
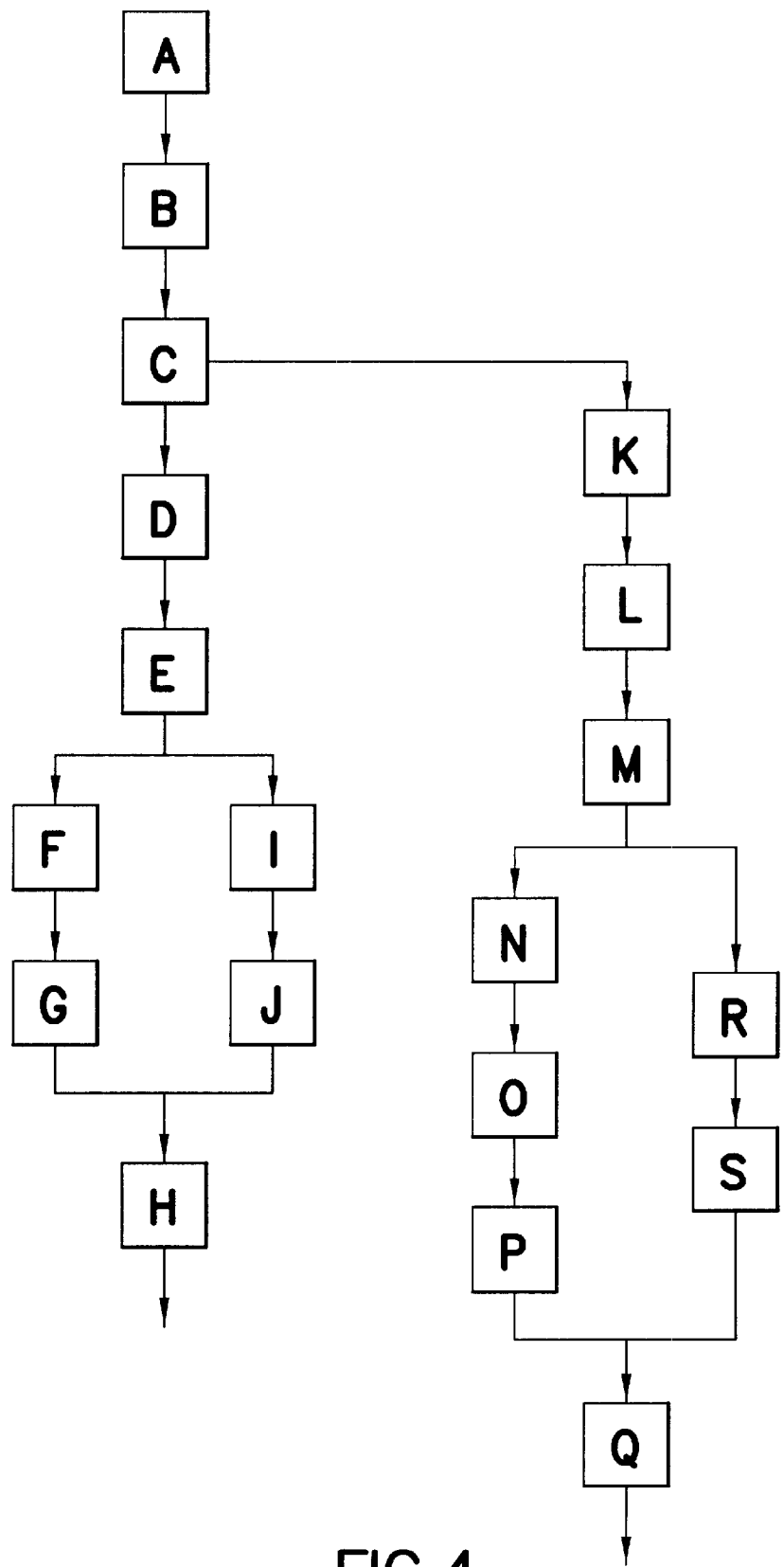
FIG. 4 is a diagram depicting the sequence of figures used to illustrate the first, second, third, and fourth exemplary processes of manufacture according to the present invention.
Figure 4A:
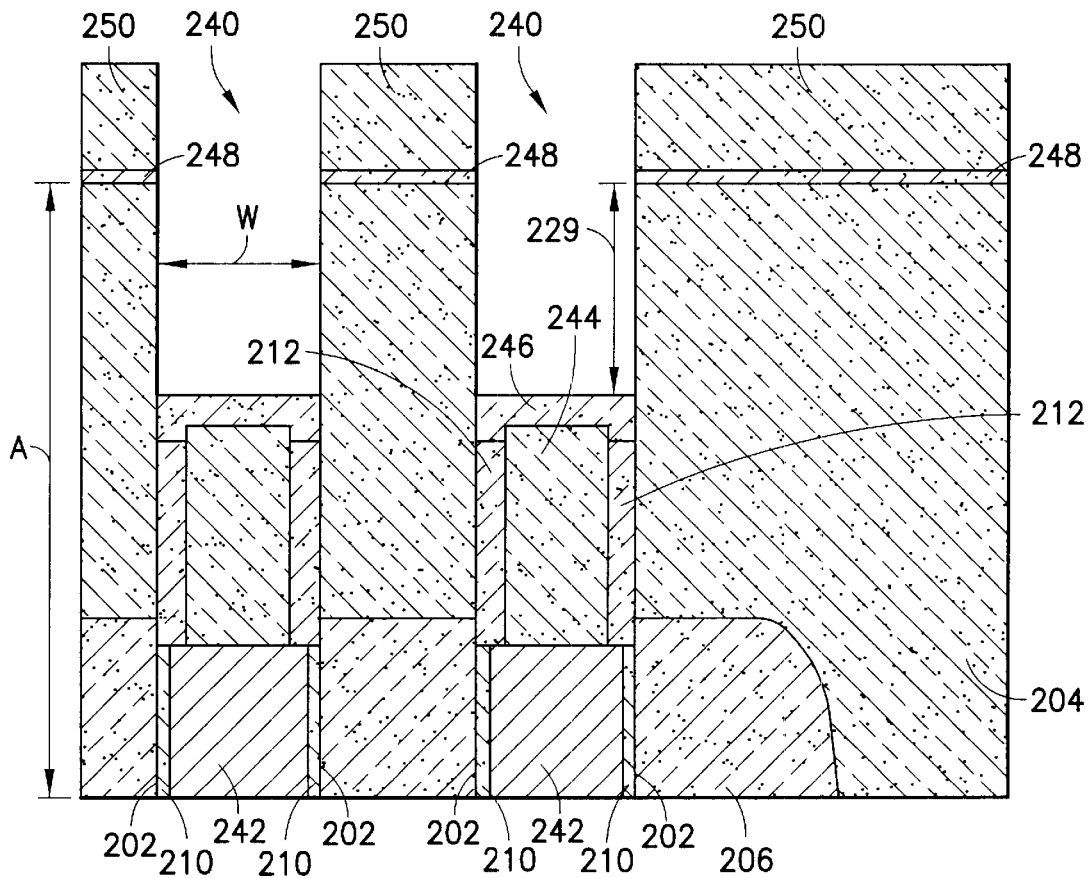
Figure 4B:
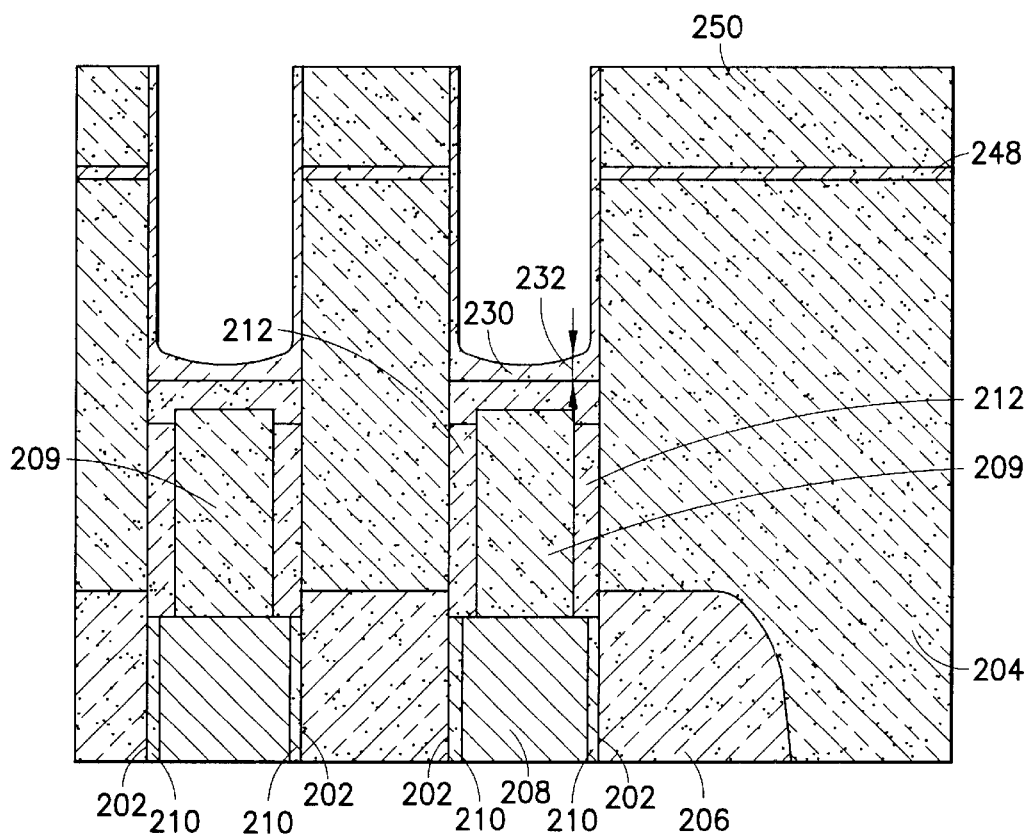
Figure 4C:
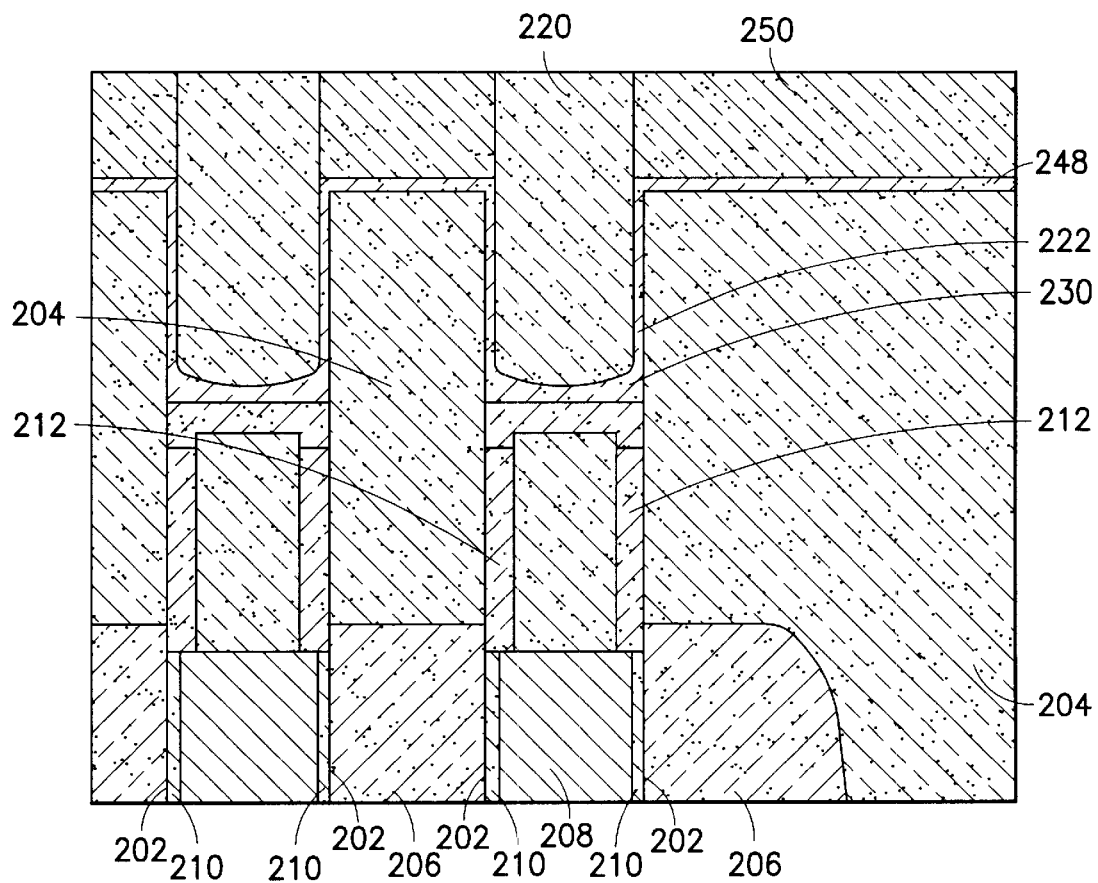
Figure 4D:
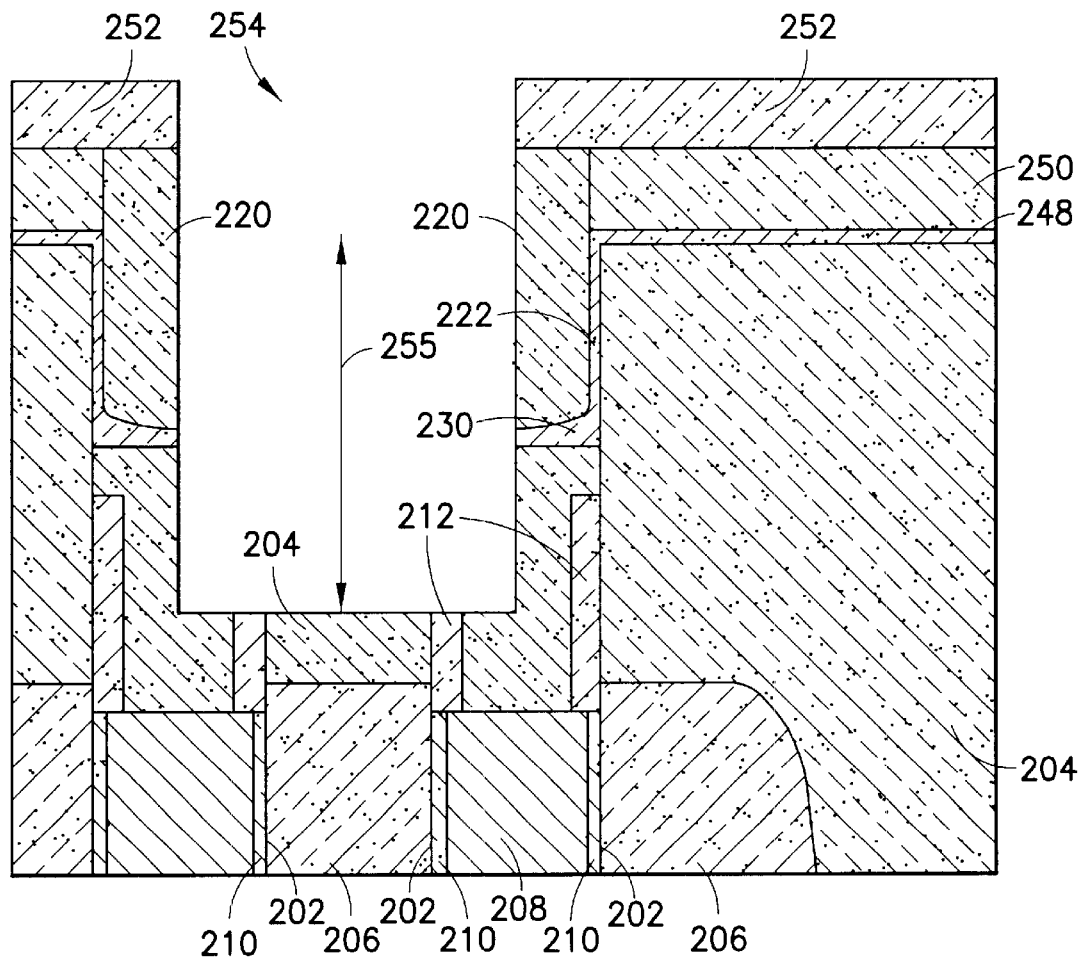
Figure 4E:
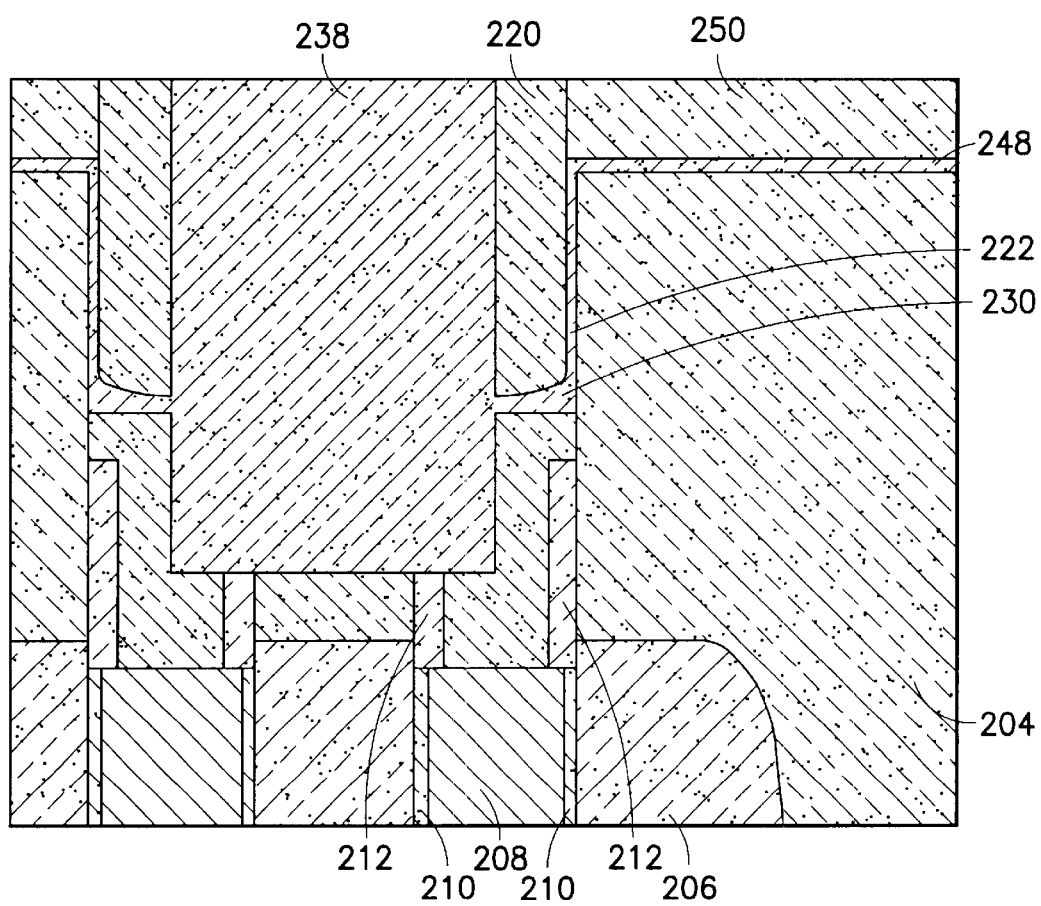
Figure 4F:
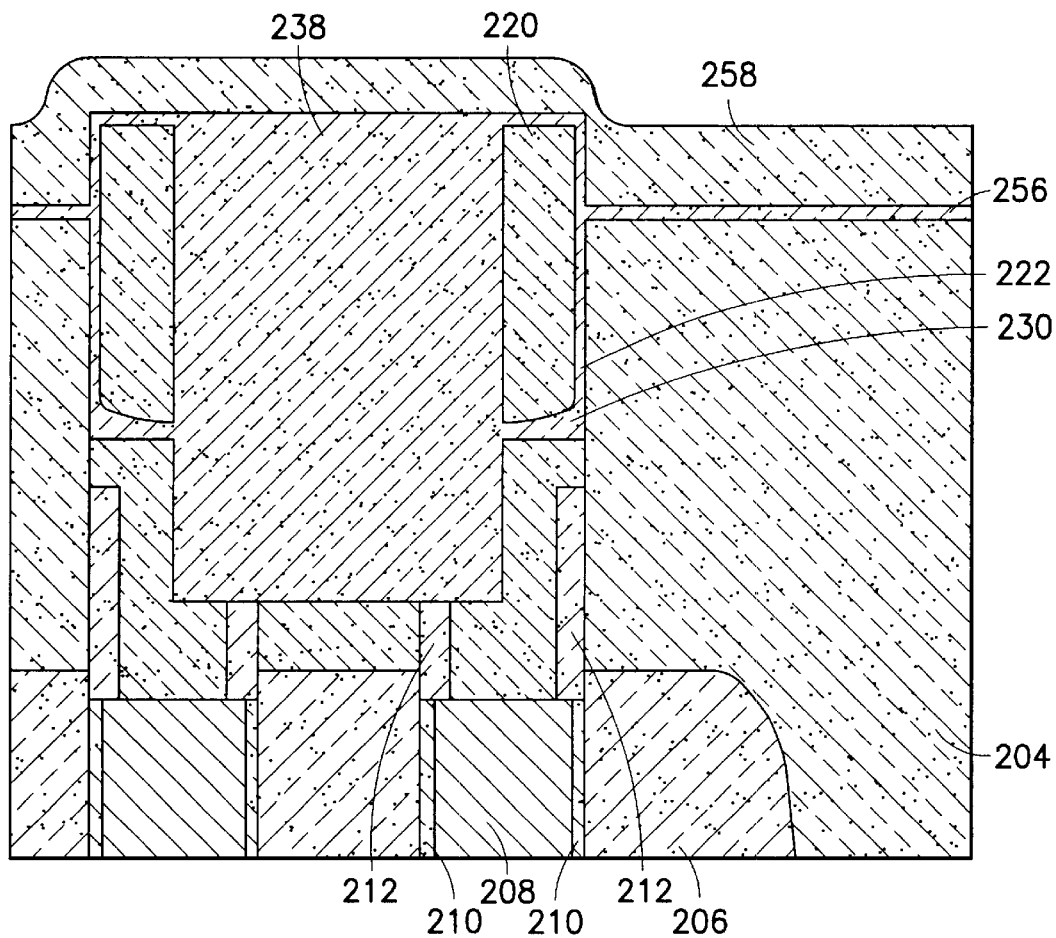
Figure 4G:
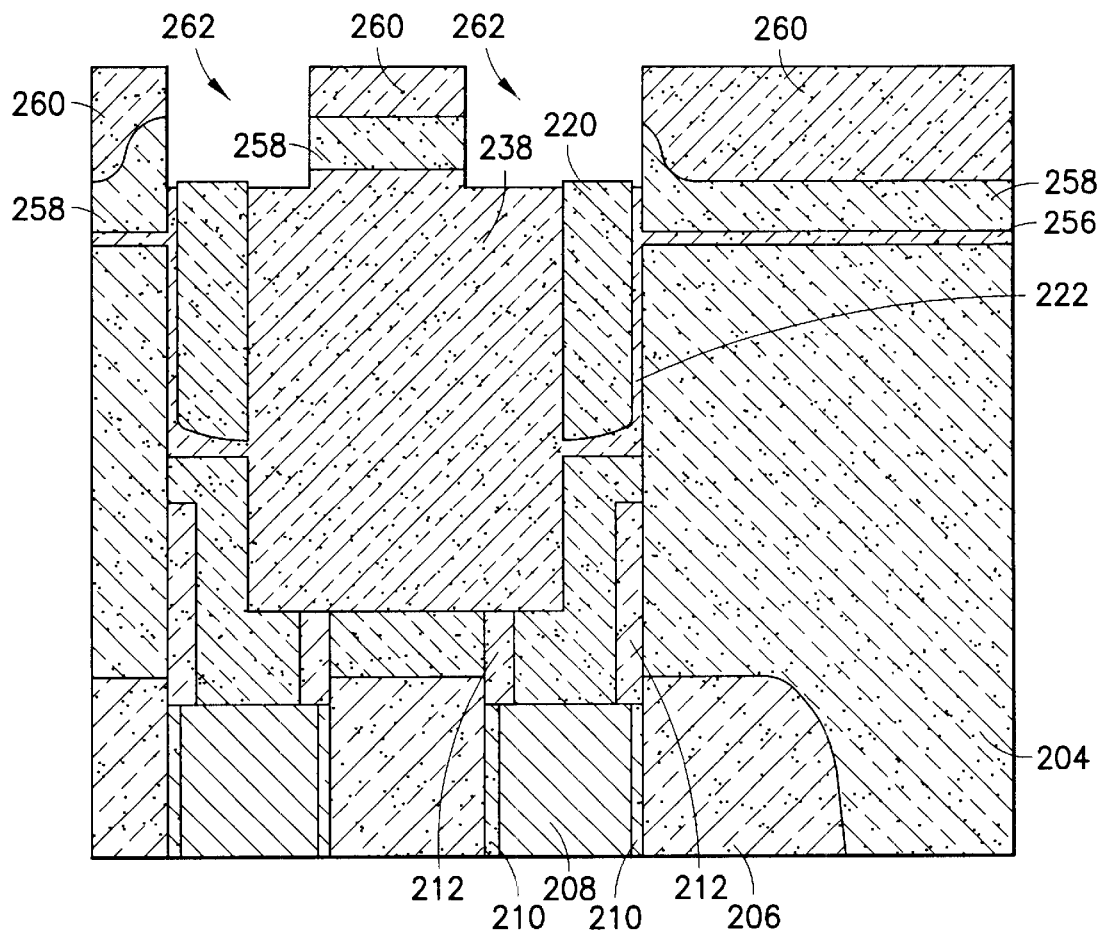
Figure 4H:
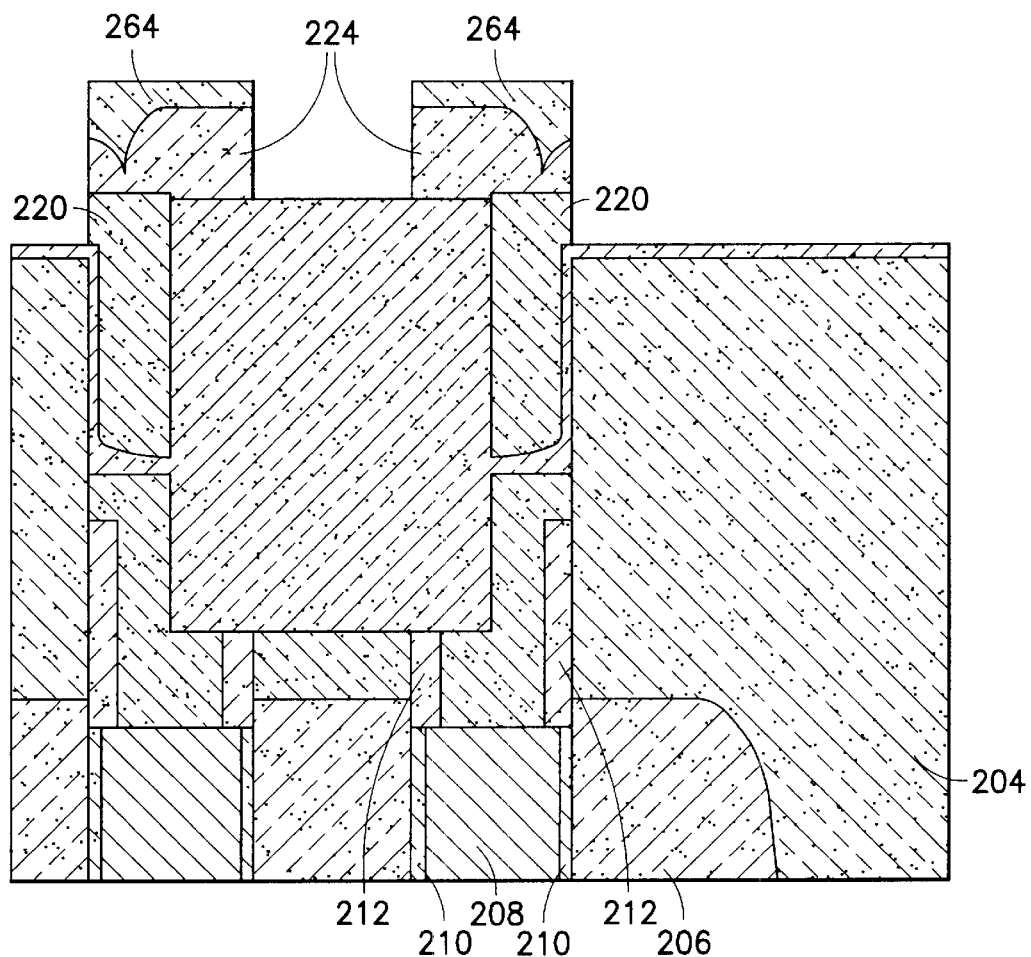
Figure 41:
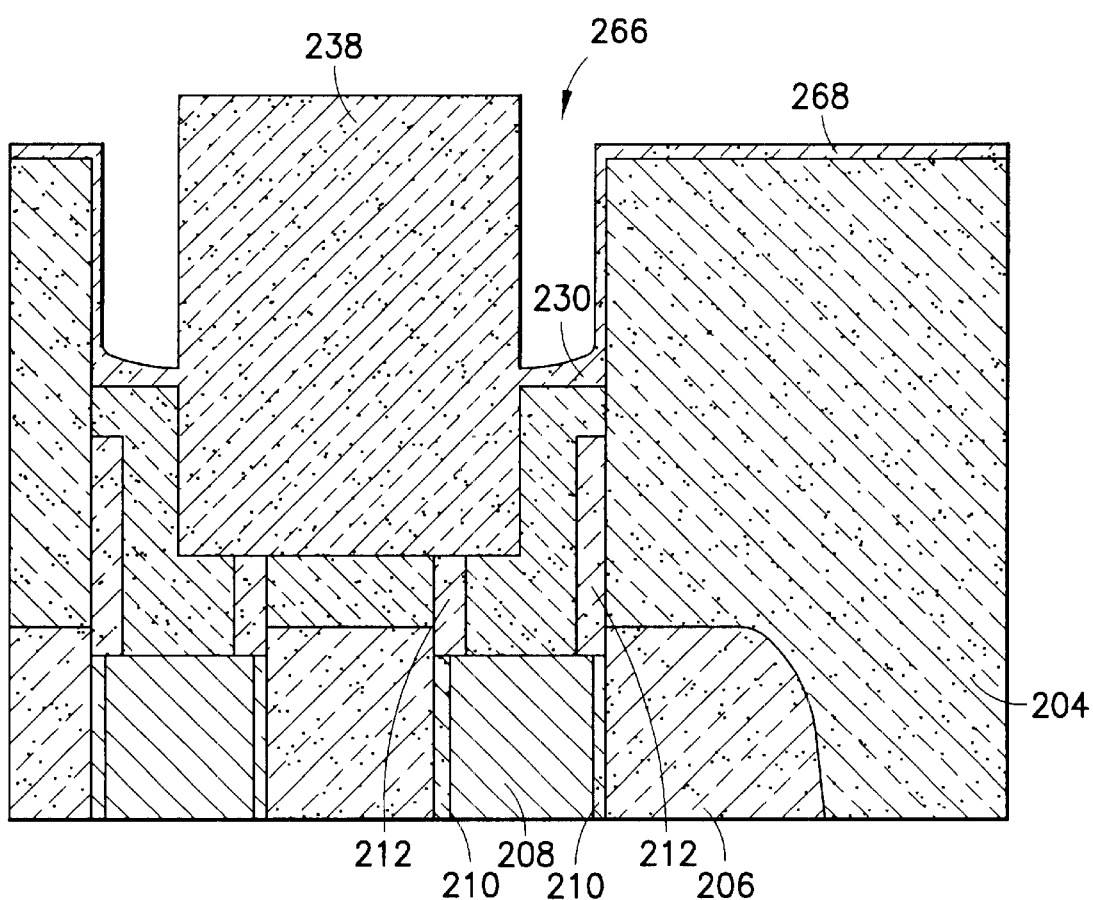
Figure 4J:
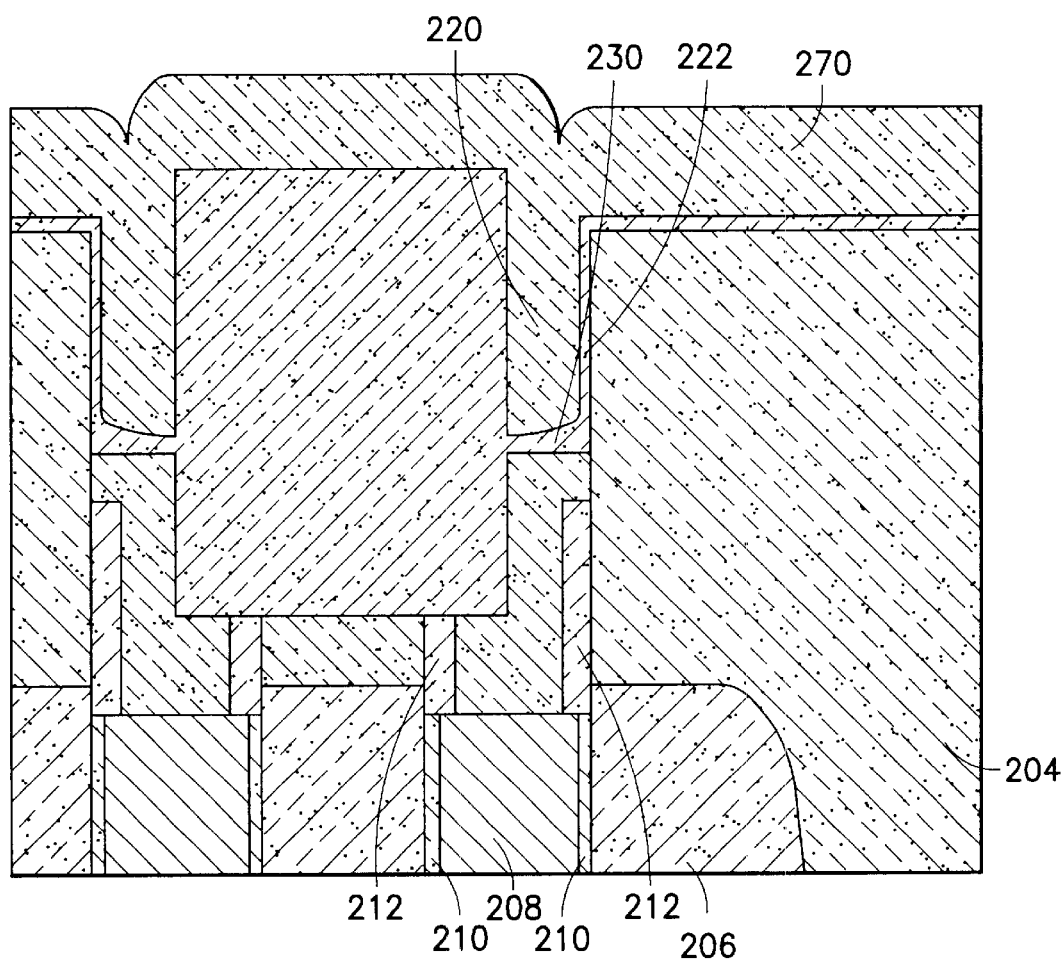
Figure 4K:
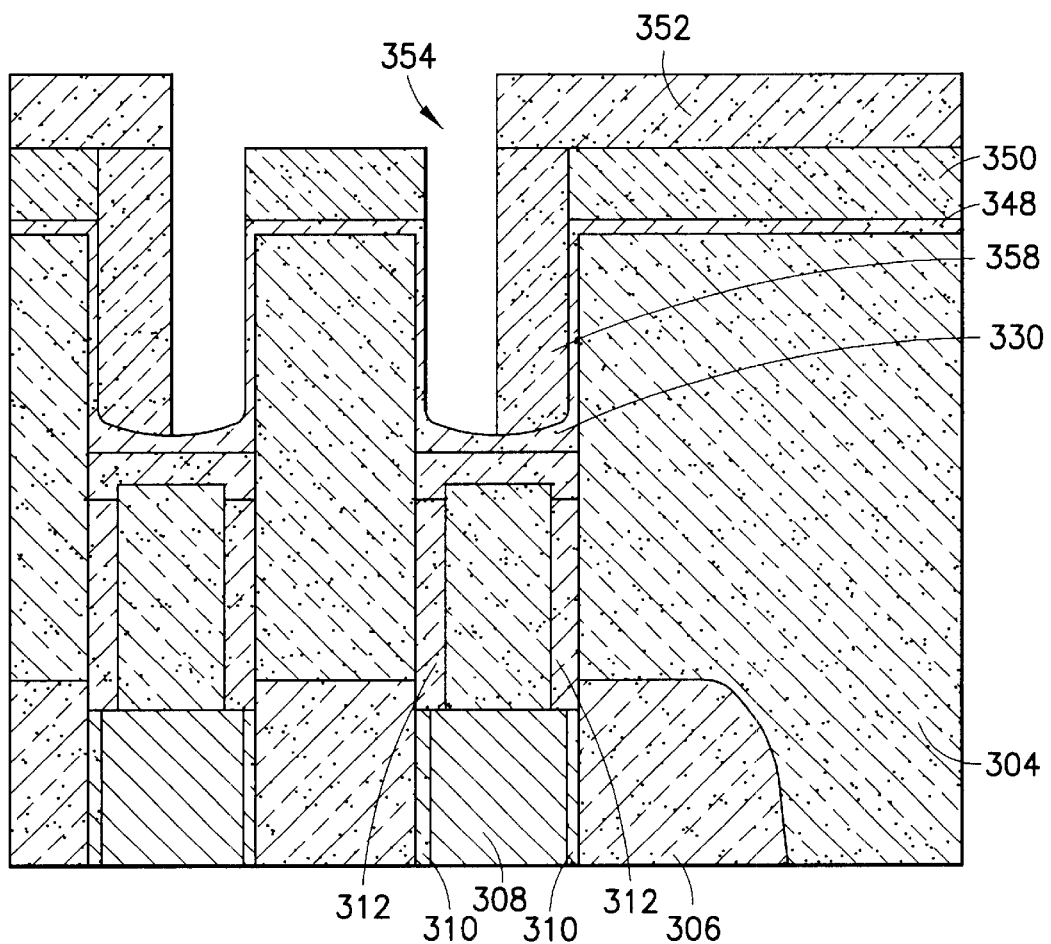
Figure 4L:
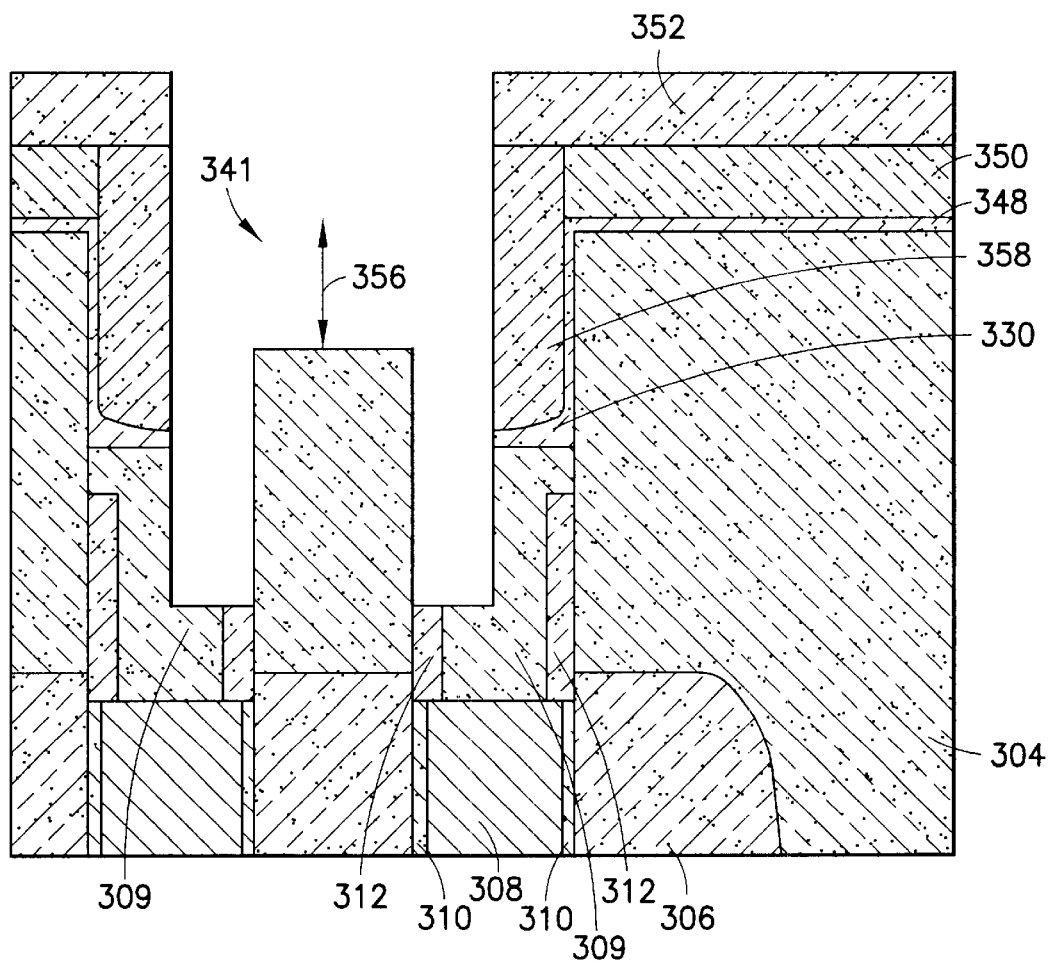
Figure 4M:
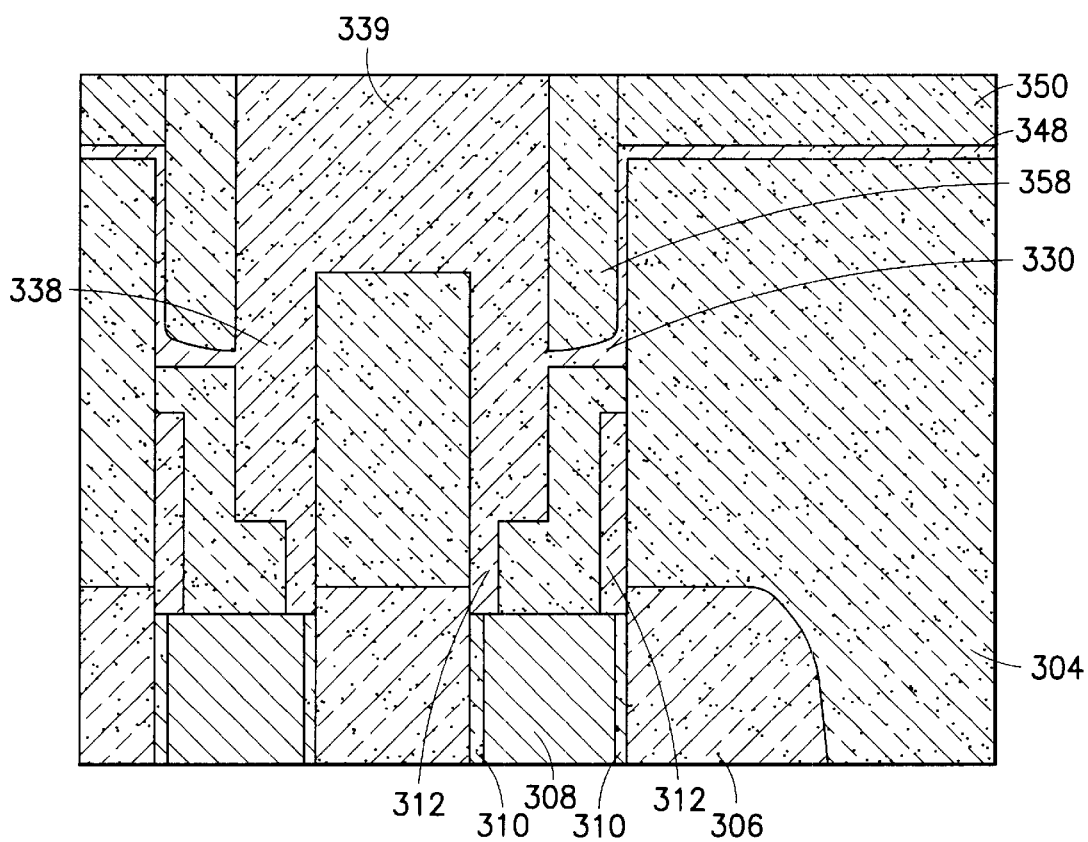
Figure 4N:
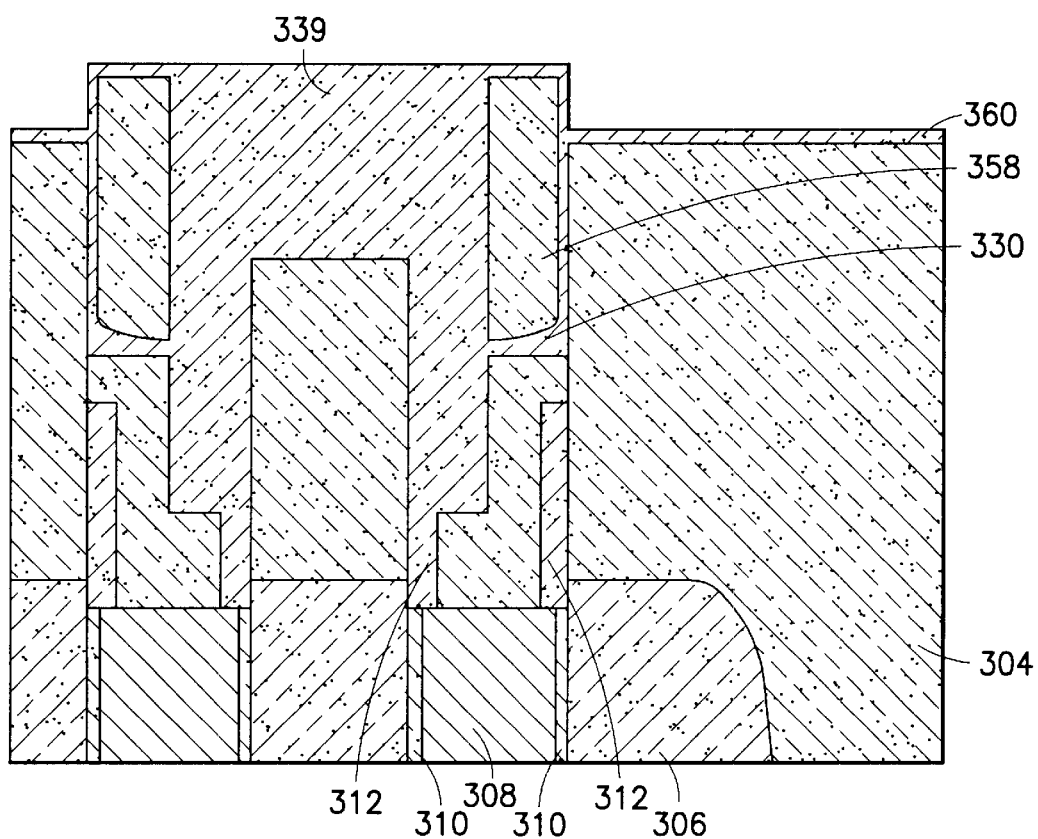
Figure 40:
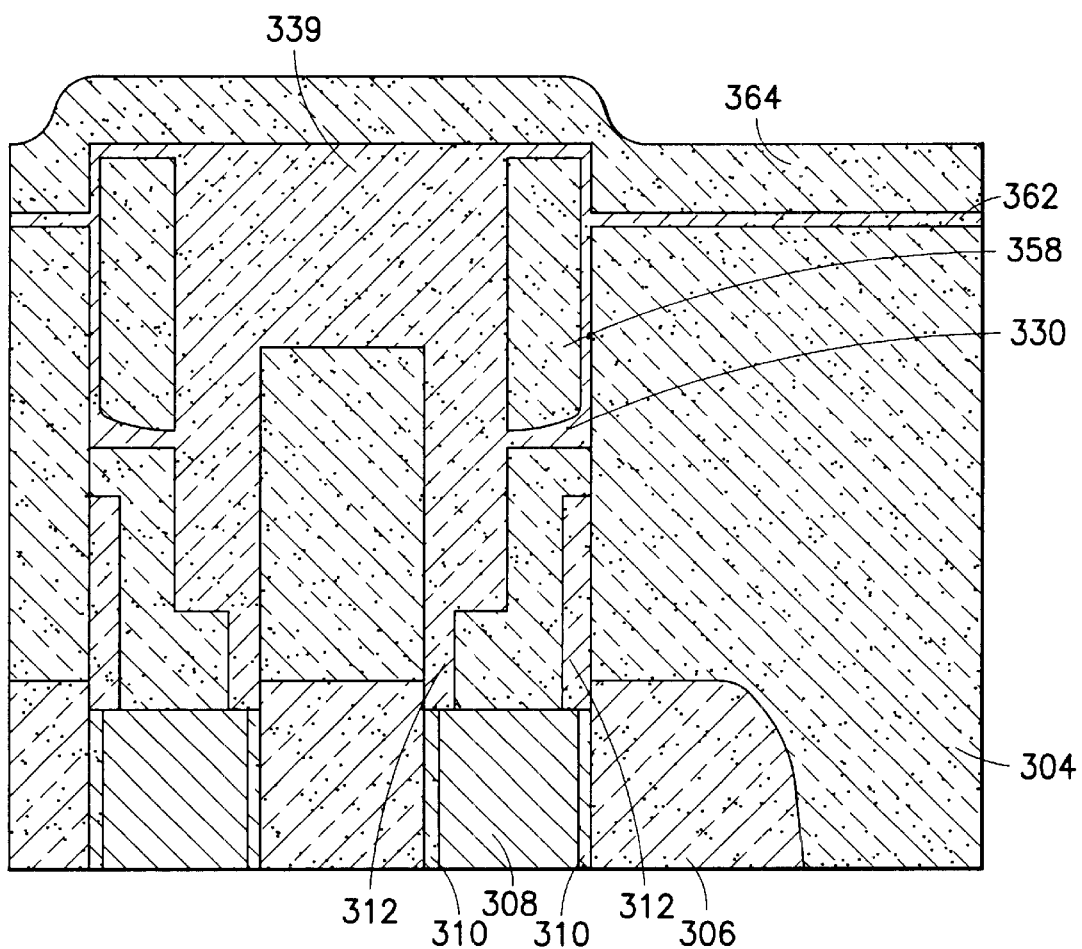
Figure 4P:
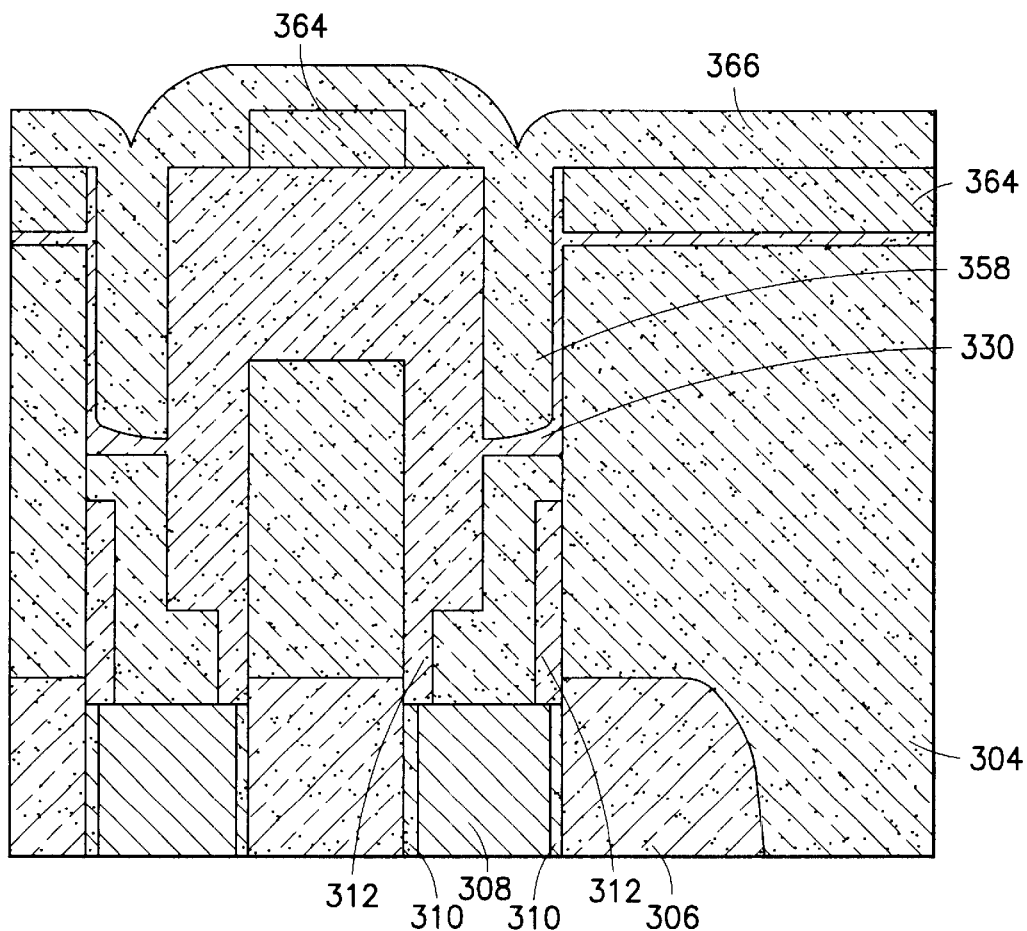
Figure 4Q:
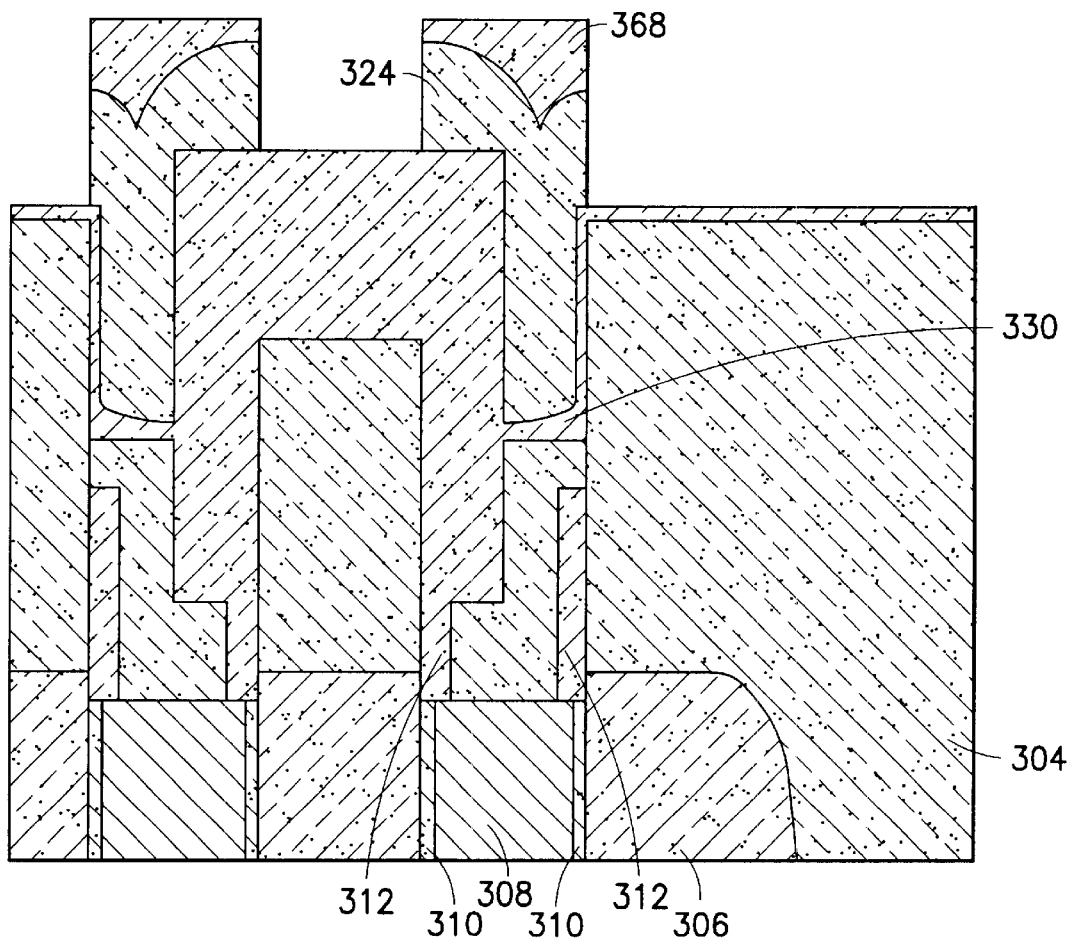
Figure 4R:
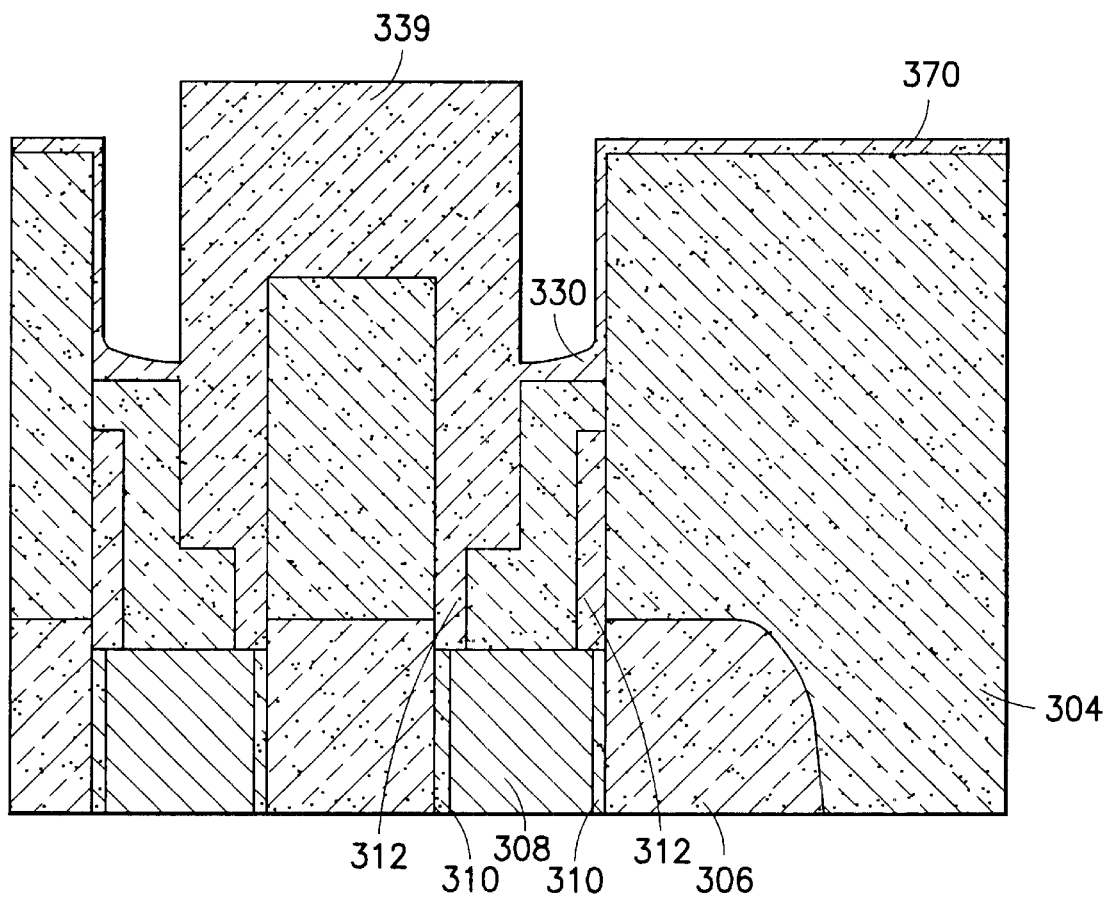
Figure 4S:
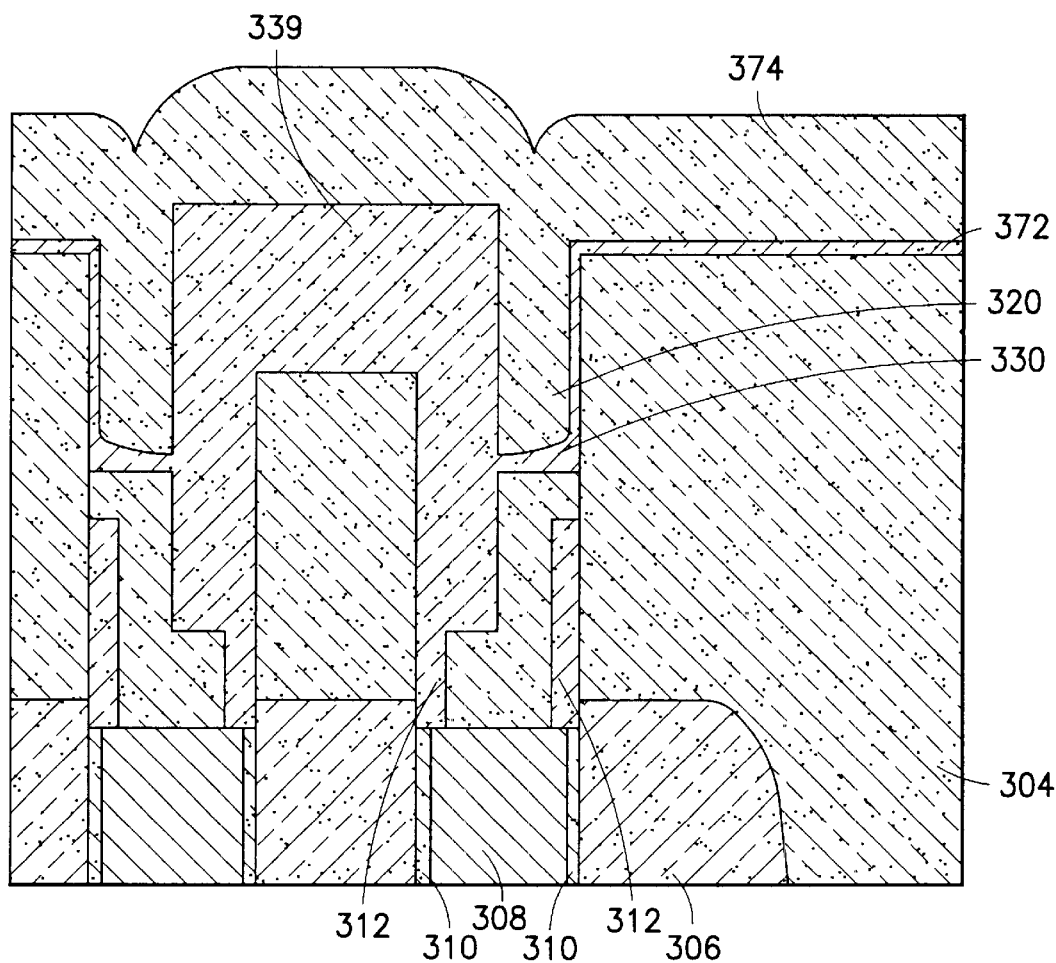

FIGS. 4A–H are cross-sectional views illustrating a first exemplary process of manufacture according to the present invention;

FIGS. 4I–J are cross-sectional views illustrating a second exemplary process of manufacture according to the present invention;

FIGS. 4K–Q are cross-sectional views illustrating a third exemplary process of manufacture according to the present invention;

FIGS. 4R–S are cross-sectional views illustrating a fourth exemplary process of manufacture according to the present invention.

DETAILED DESCRIPTION OF THE PREFERRED EMBODIMENTS AND BEST MODE OF THE INVENTION

Figure 1:
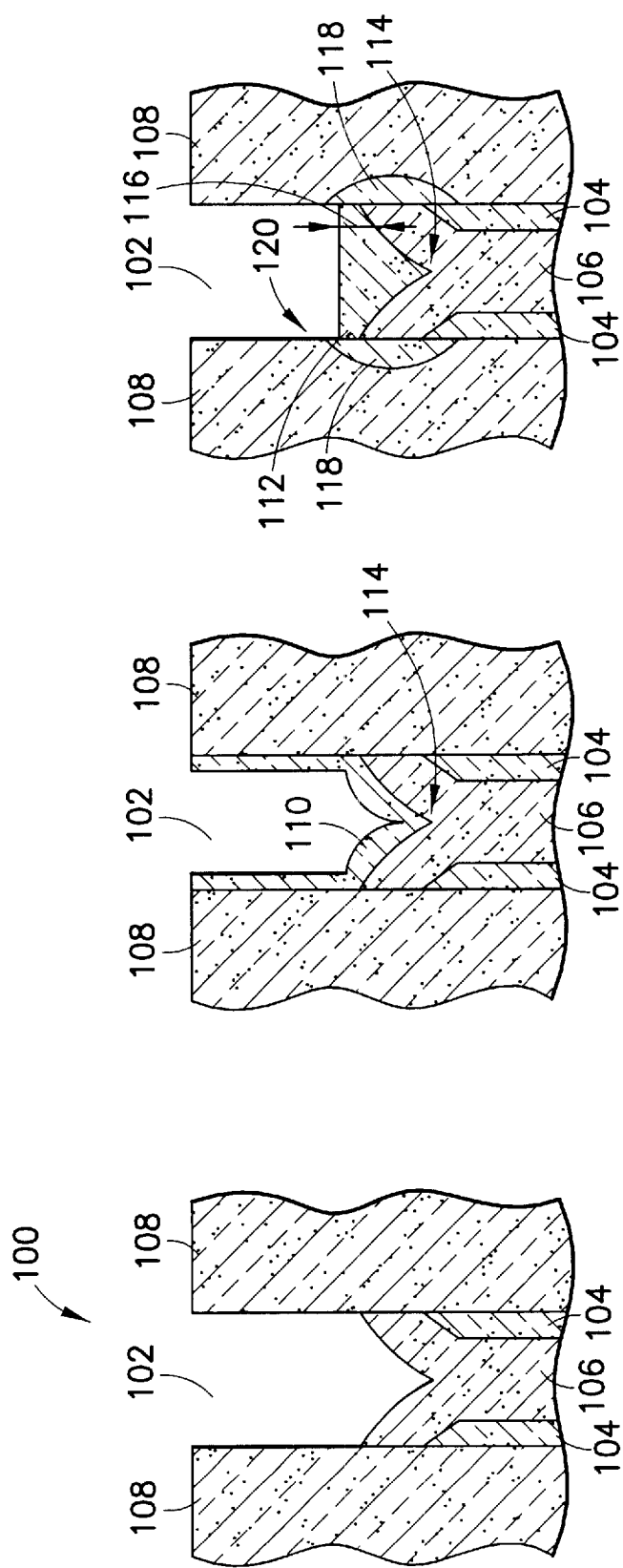

Referring now to the figures, in which like numerals refer to like elements, FIG. 1A is a partial cross-sectional view of a known DRAM cell 100. A trench DRAM 102 is formed in a substrate 108. The DRAM cell 100 includes a collar oxide 104 and a storage node conductor 106. Typically, the conductor 106 is a doped polysilicon, while the dielectric 104 is a nitride. As shown in FIGS. 1B and 1C, an oxide layer 110, 112 is formed upon the storage node conductor 106 to isolate the storage node from a signal transfer device (not shown).

The oxide layer 110 shown in FIG. 1B is formed, eg, by thermal oxidation. Although thermal oxidation allows precise control of oxide thickness, stress induced oxidation reduction may result in a thinner and weaker oxide layer at the bottom of the V groove illustrated by an arrow 114. The thinned end weak oxide 110 at the V groove 114 results in a high leakage between a transfer device gate conductor and the storage node.

The silicon dioxide or oxide layer 112 shown in FIG. 1C may be formed by chemical vapor deposition (CVD). The CVD oxide 112 may be adjusted to a depth 116 above the storage node conductor 106 by first performing CVD deposition and then planarizing by chemical-mechanical polishing (CMP), for example. The CVD oxide 112 may then be recessed to a depth 116 by reactive ion etching (RIE). Although the CVD oxide 112 fills the V groove 114, reactive ion etching may provide poor control of the depth 116 of the CVD oxide 112. Precise control of the depth 116 is important to ensure that the CVD oxide 112 is thin enough for the diffusion region 118 to overlap a channel region 120 and still be thick enough to isolate the storage node conductor 106 from the gate (not shown) of the device.

Figure 2:
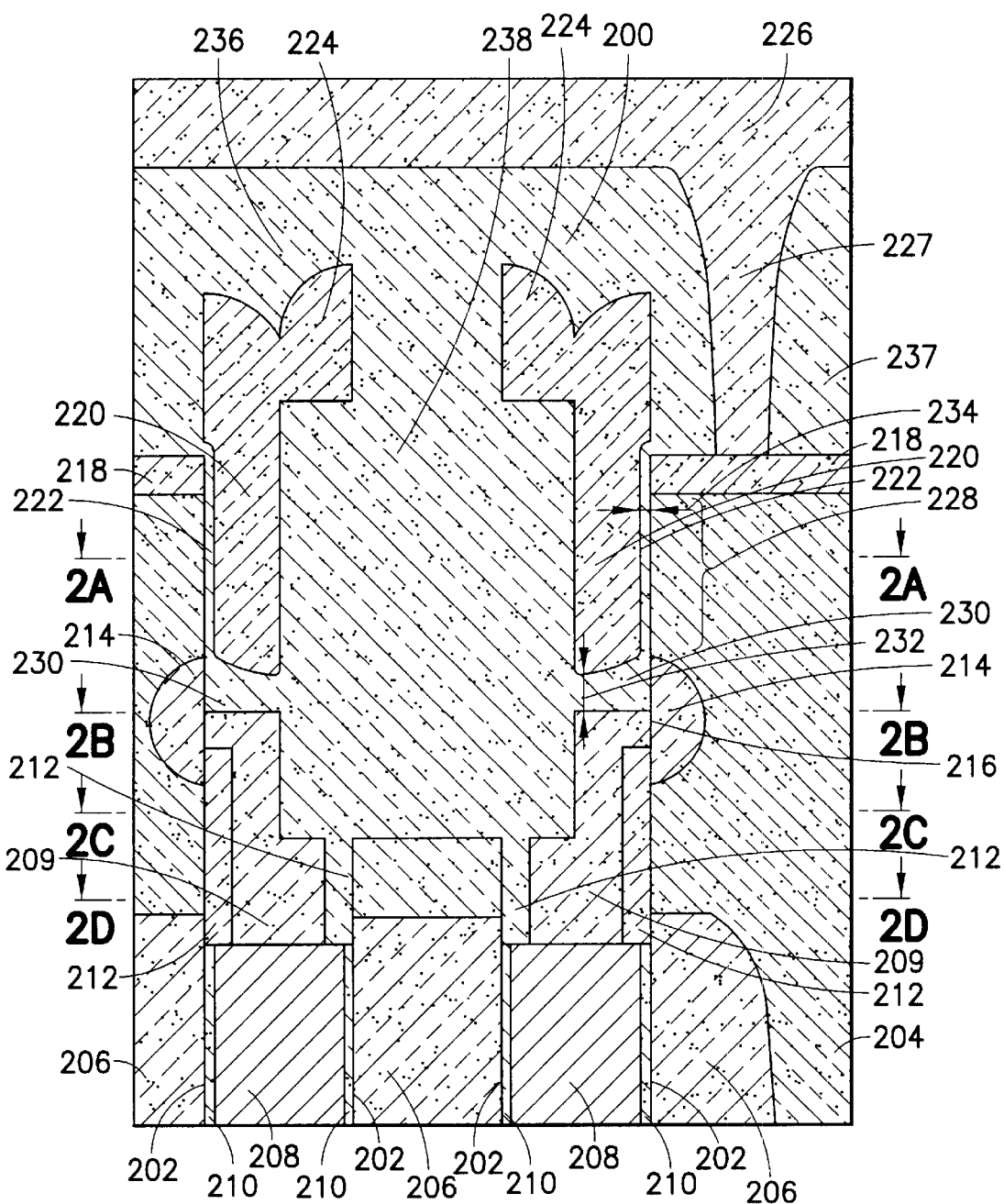
FIG. 2 is a cross-sectional view of memory devices according to an exemplary embodiment of the present invention.
Figure 2A:
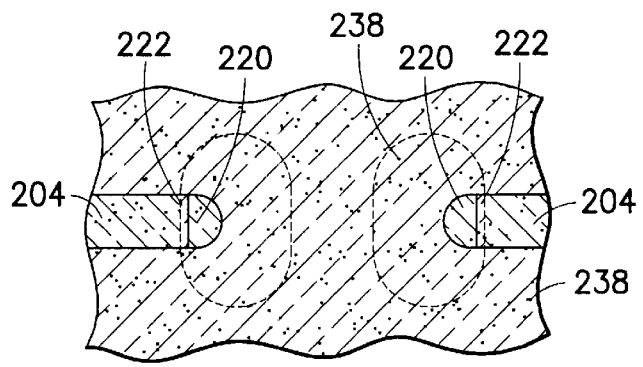
FIG. 2A is a cross-sectional view of the memory devices shown in FIG. 2 taken along the line 2A—2A.
Figure 2B:
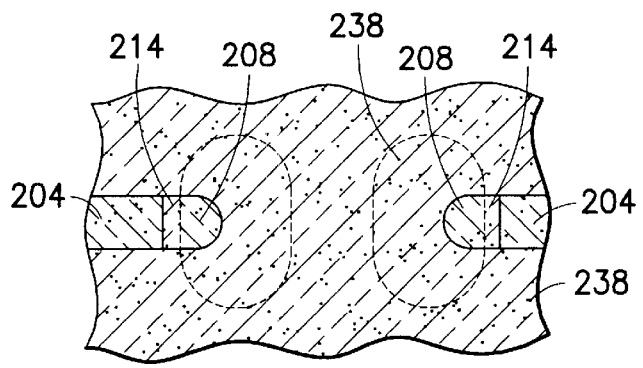
FIG. 2B is a cross-sectional view of the memory devices shown in FIG. 2 taken along the line 2B—2B.
Figure 2C:
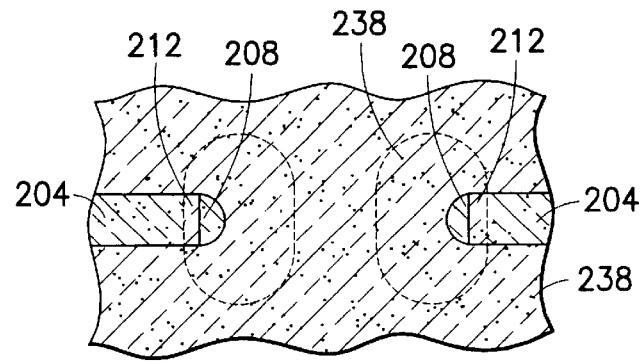
FIG. 2C is a cross-sectional view of the memory devices shown in FIG. 2 taken along the line 2C—2C.
Figure 2D:
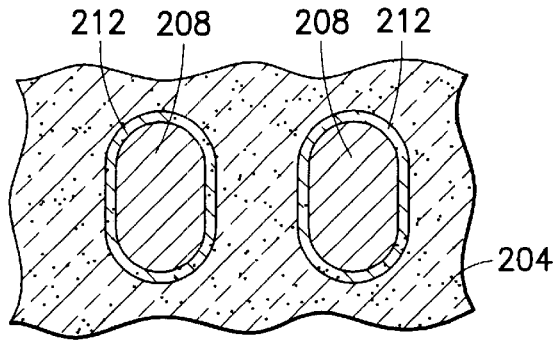
FIG. 2D is a cross-sectional view of the memory devices shown in FIG. 2 taken along the line 2D—2D.

FIG. 2 is a cross-sectional view of the DRAM device 200 according to an exemplary embodiment of the present invention. As shown in FIG. 2, the device 200 is formed using a deep trench (DT) having side walls 202 formed within a P-type silicon substrate 204. Another DRAM device 236 shown in FIG. 2 is formed adjacent to the device 200.

As known to those skilled in the art, the teachings of the present invention may also be applied to forming a memory device in an N-type silicon substrate or using other semiconductor materials. Thus, except as expressly specified hereinafter with respect to the node conductor, the present invention is not limited to the particular materials used in describing the exemplary embodiments.

The signal storage node of the memory device 200 includes an n+ buried plate 206 isolated from a storage node conductor 208 by a node dielectric 210 and a collar oxide 212. According to an essential feature of the present invention, the storage node conductor 208 comprises a metal, metal compound or metal alloy, such as tungsten, WN, TiN or a metal silicide, or other metallic materials having similar electrical, chemical and mechanical properties. Preferably, the deep trench defined essentially as the distance (W) between the layers 210 and the distance between the bottoms of 218 and 208 in FIG. 2 has a width of less than 0.12 microns, and an aspect ratio (D/W) of greater than 50. See, eg, FIG. 4A.

The signal transfer device of the memory device 200 includes a first diffusion region 214, coupled to the storage node conductor 208 by a buried strap 216, and a second diffusion region 218. The channel region 228 is controlled by the gate conductor 220 and a gate dielectric 222. The gate conductor 220 is coupled to the word line 224. The gate conductor 220 is isolated from the channel region 228 by the gate oxide layer 222 which is either grown thermally or deposited. The second diffusion region 218 is coupled to the bit line contact 227 and a bit line 226.

The gate conductor 220 is isolated from the storage node conductor 208 by the trench-top dielectric 230. In this exemplary embodiment, the trench-top dielectric 230 has a thickness 232 greater than the thickness 234 of the gate oxide 222. In an exemplary embodiment, the trench-top dielectric 230 has a thickness 232 ranging from 20 nm to 100 nm. In an exemplary embodiment, the ratio of the thickness 232 of the trench-top dielectric 230 to the thickness 234 of the gate oxide 220 ranges from 3:1 to 12:1.

The DRAM device 200 is isolated from the adjacent device 236 by an isolation trench fill insulator 238. Further insulation is provided by a passivation insulation layer 237 such as CVD oxide or boron phosphorous silicate glass (BPSG), for example. Cross-sectional views taken along lines 2A—2A, 2B—2B, 2C—2C, and 2D—2D in FIG. 2 are illustrated in FIGS. 2A–D, respectively. As illustrated, trench 240 has a circumference and the buried strap 216 contacts the side wall 202 of the trench 240 along a fragment of the trench circumference.

Figure 3:
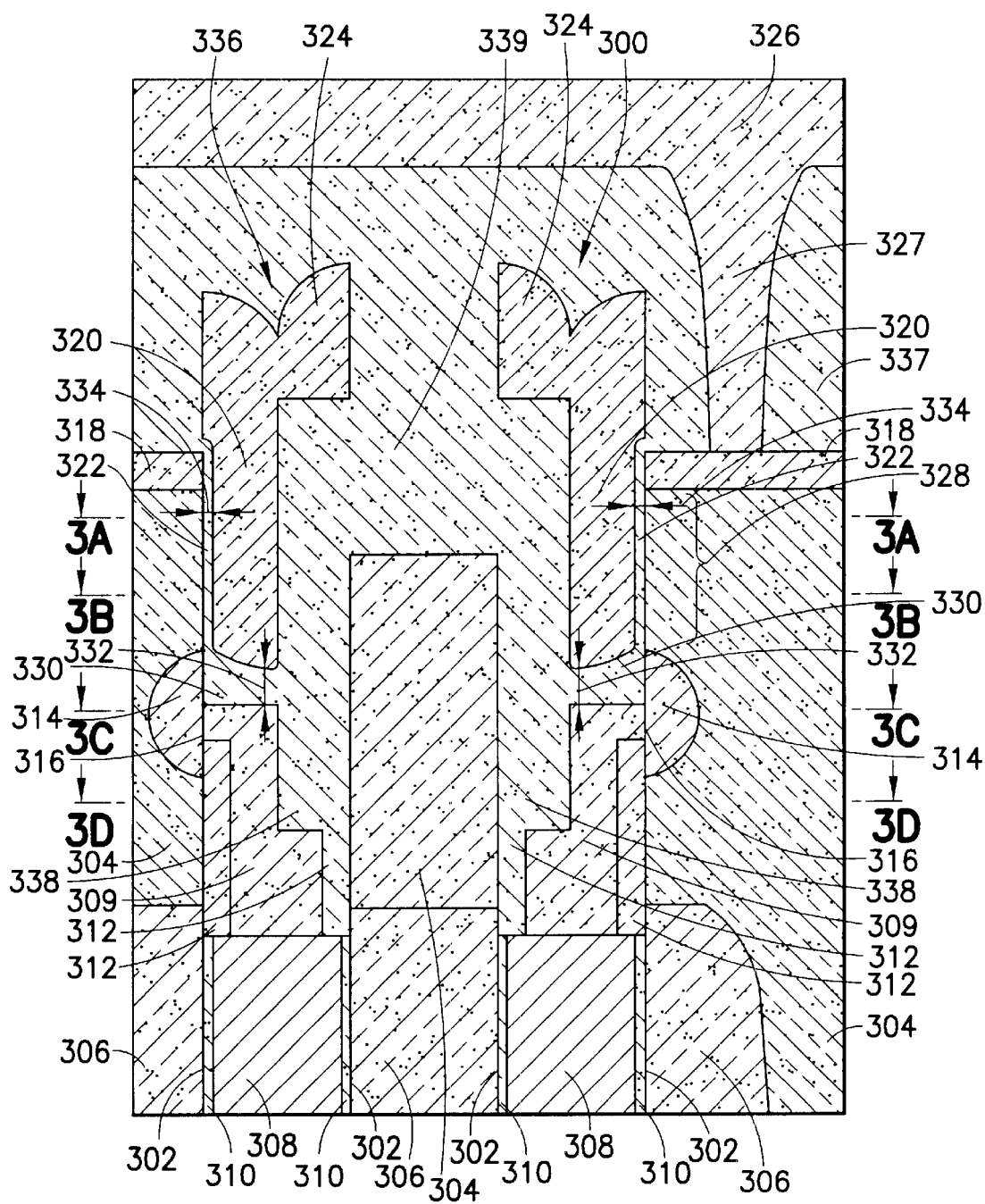
FIG. 3 is a cross-sectional view of the memory devices according to another exemplary embodiment of the present invention.
Figure 3A:
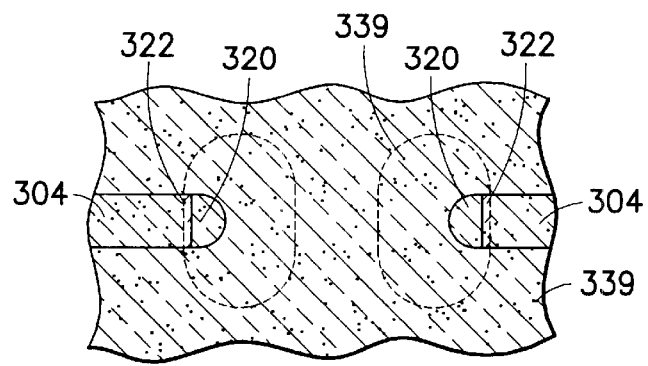
FIG. 3A is a cross-sectional view of the memory devices shown in FIG. 3 taken along the line 3A—3A.
Figure 3B:
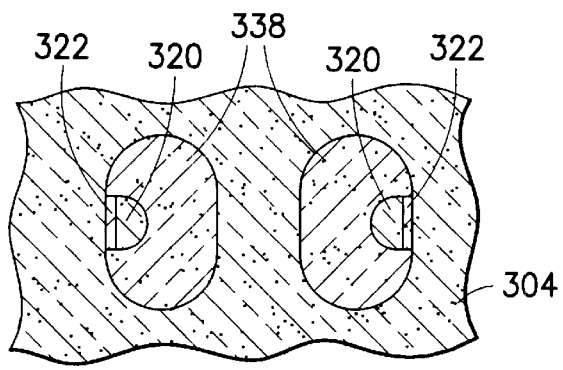
FIG. 3B is a cross-sectional view of the memory devices shown in FIG. 3 taken along the line 3B—3B.
Figure 3C:
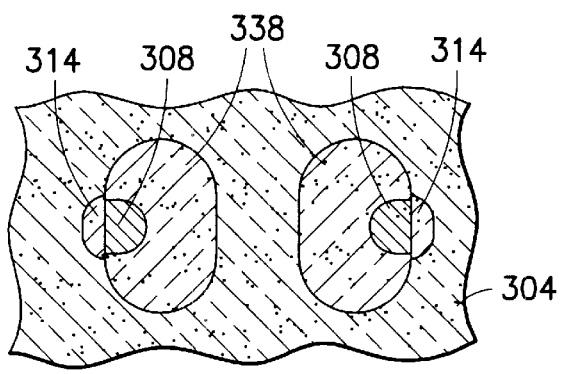
FIG. 3C is a cross-sectional view of the memory devices shown in FIG. 3 taken along the line 3C—3C.
Figure 3D:
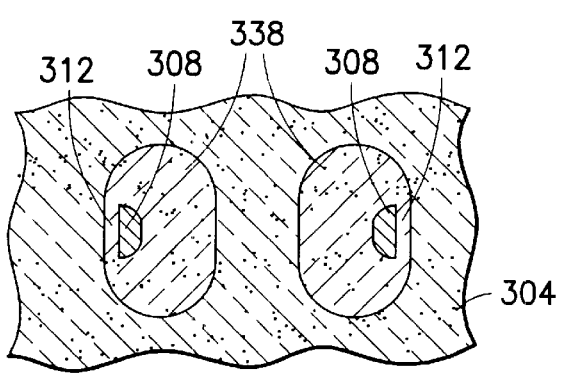
FIG. 3D is a cross-sectional view of the memory devices shown in FIG. 3 taken along the line 3D—3D.

FIG. 3 is a cross-sectional view of a DRAM device 300 according to another exemplary embodiment of the present invention. As shown in FIG. 3, the device 300 is formed using a deep trench (DT) having side walls 302 formed within a P-type silicon substrate 304. Another DRAM device 336 shown in FIG. 3 is formed adjacent to device 300.

The signal storage node of the memory device 300 includes an n+ buried plate 306 isolated from a storage node 308 by a node dielectric 310 and a collar oxide 312. According to an essential feature of the present invention, the conductor 308 comprises a metal or metal alloy such as tungsten, TiN or a metal silicide. The signal transfer device of the memory device 300 includes a first diffusion region 314, coupled to the storage node conductor 308 by a buried strap 316, and a second diffusion region 318. The channel region 328 is controlled by the gate conductor 320 and a gate dielectric 322. The gate conductor 320 is isolated from the channel region 328 by the gate oxide (gate dielectric) layer 322. The second diffusion region 318 is coupled to the bit line 326 by a bit line contact 327.

The gate conductor 320 is isolated from the storage node conductor 308 by the trench-top dielectric 330. In this exemplary embodiment, the trench-top dielectric 330 has a thickness 332 greater than the thickness 334 of the gate oxide 322. In an exemplary embodiment, the trench-top dielectric 330 has a thickness 332 ranging from 20 nm to 100 nm. In an exemplary embodiment, the ratio of the thickness 332 of the trench-top dielectric 330 to the thickness 334 of the gate oxide 320 ranges from 3:1 to 12:1.

The DRAM device 300 is isolated from the adjacent device 336 by a trench fill insulator 338 and a shallow trench isolation 339. Preferably, the deep trench has a width of less than 0.12 microns, and an aspect ratio of greater than 50. Further insulation is provided by a passivation insulation layer 337 such as CVD oxide or BPSG. FIGS. 3A–D are cross-sectional views taken along the lines 3A—3A, 3B—3B, 3C—3C and 3D—3D in FIG. 3, respectively.

Processes of Manufacture

FIG. 4 illustrates the process flow for four exemplary processes of manufacture according to the present invention. Each lettered block in FIG. 4 corresponds to a figure. For example, block A in FIG. 4 corresponds to FIG. 4A, block B in FIG. 4 corresponds to FIG. 4B, and so on.

The first and second exemplary processes of manufacture according the present invention are processes for manufacturing a memory device 200 as shown in FIG. 2. Blocks A–B–C–D–E–F–G–H of FIG. 4 correspond to a first exemplary process of manufacture. Blocks A–B–C–D–E–I–J–H of FIG. 4 correspond to a second exemplary process of manufacture according to the present invention.

The third and fourth exemplary processes of manufacture according to the present invention are processes for manufacturing a memory device 300 as shown in FIG. 3. Blocks A–B–C–K–L–M–N–O–P–Q of FIG. 4 correspond to a third exemplary process of manufacture according to the present invention. Blocks A–B–C–K–L–M–R–S–Q of FIG. 4 correspond to a fourth exemplary process of manufacture according to the present invention.

First Exemplary Process

The first exemplary process of manufacture according to the present invention is described below with reference to FIGS. 4A–4H. FIG. 4A shows a cross-section of a wafer after deep-trenching processing. A deep-trench signal storage node is formed by etching a trench 240 into the P-type doped single crystal silicon substrate 204 through the oxide layer 248 and the nitride layer 250. Preferably, the trench has a width dimension W of less than 0.12 microns, and an aspect ratio (D/W) of greater than 50. A layer of doping source material such as arsenic doped glass (ASG) is then deposited on the side walls 202 and the bottom (not shown) of the trench 240. A photo-resist is then recessed to expose the ASG on an upper portion of the side walls 202 of the trench 240. The exposed ASG is then etched and the remaining photoresist is removed. The dopant, As, is then diffused from the ASG into the substrate 204. The diffused dopant results in the formation of an n+ buried plate 206 which functions as an electrode of the signal storage node.

The layer of ASG is then removed and the node dielectric 210 is formed. The node dielectric 210 is formed by depositing layers of silicon nitride on the side walls and the bottom (not shown) of the trench 240, and then oxidizing the silicon nitride layer surfaces. The trench 240 is then filled with a highly electrically conductive refractory node conductor which includes a metal or metal alloy such as tungsten, TiN or a metallic silicide. The node conductor 242 is deposited by, for example, a conventional LPCVD process or a conventional atomic layer CVD process. The node conductor 242 is recessed from the top of the trench 240, and a collar oxide 212 is then formed by depositing a conformal oxide layer and directionally etching (eg, RIE) the oxide from the bottom of the recessed trench.

The trench 240 is then filled with a n+ polysilicon 244 which is planarized and recessed. The exposed collar oxide 212 is etched off the side walls 202 of the trench 240.

As shown in FIG. 4A, the collar oxide 212 is etched slightly below the recessed polysilicon 244. The trench 240 is then filled with undoped or n+ doped silicon 246 which is then planarized and recessed as shown in FIG. 4A. The buried strap 216, which is a connection between the conductor 208 and the first diffusion region 214, is formed by diffusing an n− type dopant of polysilicon such as As from the polysilicon 244 through the polysilicon 246 and into the adjacent p− type silicon substrate by subsequent process heat treatments.

The distance in FIG. 4A illustrated by an arrow 229 and the lengths of the first diffusion region 214 (FIG. 2) and second diffusion region 218 (FIG. 2) determine the length of the channel region 228 (FIG. 2) of the vertical signal transfer device. In an exemplary embodiment, the distance 229 is approximately 0.35 μm or less.

As shown in FIG. 4B, a thin thermal oxide (sacrificial oxide) ranging between 5–10 nm for example, is grown over the exposed side wall 202 and trench-top polysilicon 246. Then, the trench-top dielectric 230 is formed to cover the top of the buried strap. In an exemplary embodiment, the trench-top dielectric 230 has a thickness 232 of about 50 nm on top of the trench-top polysilicon 246 and about 5 nm on the side walls 202 of the trench. In this exemplary embodiment, the trench-top dielectric 230 is formed using flowable oxide (FOX) or high density plasma (HDP) oxide deposition. These processes result in a thicker oxide layer being formed on top of the buried strap than on the side walls 202 of the trench 240. The deposited oxide 230 is then annealed to increase its density and reduce leakage current. In an exemplary embodiment, the deposited oxide 230 is annealed to shrink its volume by a factor of about 0.8.

In an exemplary embodiment, the trench-top dielectric 230 is deposited using an inductively coupled high density plasma (HDP) process. This process uses simultaneous sputtering and deposition which may be tuned, by the RF bias, to maximize the oxide deposited on horizontal features (trench-top polysilicon 246) and minimize deposited oxide on vertical features (side wall 202).

In another exemplary embodiment, the thinner oxide on the substantially vertical side wall 202 of the trench 240 may then be selectively and controllably removed by a gas phase chemical oxide removal (COR) process. The COR process is described by Jeng, et al. in U.S. Pat. No. 5,282,925, which is incorporated herein by reference for its teachings on oxide removal. The COR process uses gas phase reactants to form a self-limiting etch that is adjustable. The COR process may be adjusted to remove all the oxide on the side wall 202 of the trench 240 while retaining a desired thickness 232 of the trench-top dielectric 230. As known to those skilled in the art, the thickness 232 of the trench-top dielectric 230 may be adjusted to be thin enough to allow the first diffusion region 214 to overlap the channel region 228 and thick enough to isolate sufficiently the storage node conductor 208 from the gate conductor 220. Alternatively, a diluted HF etch may be used to remove the oxide from the side wall 202 of the trench 240.

In an exemplary embodiment, an HDP process is used to deposit 50 nm of oxide on the trench-top polysilicon 246 and 10 nm of oxide on the trench 240 side wall 202. In the exemplary embodiment, the COR process may then be used to remove 15 nm of oxide which ensures removal of all oxide from the side wall 202 while retaining a trench-top dielectric thickness of 35 nm.

In an exemplary embodiment, the thickness 232 of the trench-top dielectric 230 is reduced to approximately 30 nm. The trench-top dielectric 230 isolates the gate conductor 220 from the storage node conductor 208. In a preferred embodiment, the trench-top dielectric 230 has a thickness 232 sufficient to result in a leakage current through the trench-top dielectric 230 of less than $10^{-17}$ amperes. As shown in FIG. 4C, the gate dielectric 222 is then grown thermally or deposited on the side walls 202 of the trench 240. The trench 240 is then filled with n+ polysilicon 220 and planarized to the top of the nitride 250.

As shown in FIG. 4D a photolithographically defined mask 252 is formed and an isolation trench 254 is etched between the trenches of adjacent devices 200, 236. The isolation trench 254 is formed through the oxide layer 248, nitride layer 250, and into part of the n+ polysilicon 220, the trench-top dielectric 230, the storage node n+ polysilicon 209, the collar oxide 212, and the substrate 204. In an exemplary embodiment, the isolation trench 254 has a depth of approximately 600 nm as illustrated by an arrow 255. In the exemplary embodiment illustrated in FIG. 4D, the isolation trench 254 separates the signal transfer device (including the diffusion region 214 shown in FIG. 2) of the DRAM cell 200 from adjacent devices such as the device 236.

The exposed silicon 204 surface is oxidized. In an exemplary embodiment, approximately three (3) nm of oxide is formed on the single crystal silicon 204. As shown in FIG. 4E, the isolation trench 254 is then filled with an isolation trench fill insulator 238. In an exemplary embodiment, the isolation trench 254 is filled with silicon dioxide by CVD. The device is then planarized to the top of the nitride layer 250 by CMP, for example.

As shown in FIG. 4F, the oxide layer 248 and the nitride layer 250 are stripped. A sacrificial oxide layer (not shown) is then grown over the exposed planar silicon substrate 204 surface. As known to those skilled in the art, the sacrificial oxide layer may be used to remove defects from the substrate 204 surface. In an exemplary embodiment, the sacrificial oxide has a thickness of approximately 5 nm. The sacrificial oxide is then stripped. A gate oxide layer 256 is grown and a polysilicon gate conductor layer 258 is deposited for planar support circuit devices. In an exemplary embodiment, the gate oxide layer 256 has a thickness of approximately 4 nm and the gate conductor layer 258 has a thickness of approximately 50 nm.

As shown in FIG. 4G, a photoresist mask 260 is formed. Contact holes 262 are then etched through the gate oxide layer 256 and polysilicon gate conductor layer 258 to expose the gate conductor polysilicon 220. The photoresist 260 is then removed.

As shown in FIG. 4H, a word line conductor 224 is then deposited through the contact hole 262 (FIG. 4G) to contact the gate conductor 220. In an exemplary embodiment, the word line conductor 224 has a thickness of approximately 75 nm. In another exemplary embodiment, a thin layer of silicide (not shown) such as $CoSi_x$, $TiSi_x$, or $WSi_x$ may be deposited upon the word line conductor 224 to reduce the resistivity of the word line 224. Reduced word line resistance may be desirable for increased DRAM device performance. A photoresist 264 is then deposited upon the gate conductor 224 and patterned. An etch is then performed to form the word line 224 and the gate (not shown) of support circuit devices.

As shown in FIG. 2, the second diffusion region 218 is formed by implanting with a dopant such as As or P, for example. The dopant may be activated thermally by rapid thermal annealing or by conventional furnace annealing processes, for example. The buried strap 216 and first diffusion region 214 may be formed by the prior thermal treatments and the annealing process used to form the second diffusion region 218.

A dielectric film 237 such as a CVD oxide, for example, is then deposited and planarized as shown in FIG. 2. A contact hole is formed through the dielectric film 237 to the second diffusion region 218. The contact hole is filled with a conductor such as n+ doped polysilicon or W and is planarized to form the bit line contact 227. A bit line 226 formed of Al or Cu, for example, is then formed upon the bit line contact 227.

Second Exemplary Process

The second exemplary process of manufacture according to the present invention is described below with references to FIGS. 4I and 4J. As illustrated by FIG. 4, blocks A–B–C–D–E–I–J–H correspond to the second exemplary process of manufacture.

Referring to FIG. 4I, after performing the process of the first exemplary embodiment described above with regard to FIGS. 4A through 4E, the polysilicon remaining in the half-trench 266 is removed. As known to those skilled in the art, a mask may not be necessary to remove the polysilicon from the half-trench 266. The term half-trench does not signify that exactly one-half of the trench is opened. The teachings of the present invention may be applied to pattern the mask to expose a portion of the trench. The nitride layer 250 and the oxide layer 248 are then removed and a sacrificial oxide layer 268 is grown to prepare the substrate 204 surface for gate processing.

As shown in FIG. 4J, the sacrificial oxide layer 268 is stripped and the gate oxide layer 222 is grown. The half-trench 266 is then filled with and the wafer surface is coated with a polysilicon 270. This polysilicon 270 forms the gate 220, the word line 224 (FIG. 2), and a gate for the support circuitry planar devices (not shown). A photoresist 264 (FIG. 4H) is then coated upon the polysilicon 270 and patterned. The remaining process steps for the second exemplary process are similar to those described above with regard to FIG. 4H and FIG. 2.

Third Exemplary Process

The third exemplary process of manufacture according to the present invention is described below with reference to FIGS. 4K–Q. As illustrated by FIG. 4, blocks A–B–C–K–L–M–N–O–P–Q correspond to the third exemplary process of manufacture.

Referring to FIG. 4K, after performing the process described above for the first exemplary embodiment with reference FIGS. 4A–C, a photoresist 352 is deposited and patterned and the polysilicon 358 remaining in the half-trench 354 is removed up to the trench-top dielectric 330.

As shown in FIG. 4L, the photoresist 352 is again used as a mask for further etching. The further etch breaks through the trench-top dielectric 330 and the n+ polysilicon 309 and into a portion of the collar oxide 312. The further etch creates a shallow trench isolation (STI) region 341 to isolate the device 300 from adjacent devices and for isolating support circuitry devices (not shown). In an exemplary embodiment, the further etch forms a STI region 341 having a depth of about 250 nm as illustrated by an arrow 356.

As shown in FIG. 4M, the STI region 341 is filled with an oxide 339 and then planarized. As shown in FIG. 4N, the nitride layer 350 and the oxide layer 348 are then stripped. A sacrificial oxide layer 360 is grown to prepare the planar surfaces for gate processing for the support circuitry (not shown).

As shown in FIG. 4O, the sacrificial oxide layer 360 is stripped and a gate oxide layer 362 is grown. A layer of polysilicon 364 is then deposited. The gate oxide 362 and the polysilicon 364 are used to form a gate for support circuitry (not shown).

A mask (not shown) is used to etch the polysilicon 364 and the oxide 362 over the polysilicon 358. As shown in FIG. 4P, the mask is then removed and a polysilicon layer 366 is deposited. As shown in FIG. 4Q, a photoresist 368 is then deposited upon the polysilicon 270 and patterned, and the word line 324 is etched. Further processing to complete a device shown in FIG. 3 is similar to the process described above for the first exemplary process according to the present invention with regard to FIG. 2.

Fourth Exemplary Process

The fourth exemplary process of manufacture according to the present invention is described below with reference to FIGS. 4R and 4S. As illustrated by FIG. 4, blocks A–B–C–K–L–M–R–S–Q correspond to the fourth exemplary process of manufacture.

Referring to FIG. 4R, after performing the process of the third exemplary embodiment described above with regard to FIGS. 4A–C and FIGS. 4K–M, the remaining polysilicon 358 is etched out of the other half-trench up to the trench-top dielectric 330. The nitride layer 350 and the oxide layer 348 are then stripped and a sacrificial oxide layer 370 is grown to prepare the substrate 304 for gate processing.

As shown in FIG. 4S, the sacrificial oxide 370 is stripped and a gate oxide layer 372 and a polysilicon layer 374 are formed. The polysilicon layer 374 fills the empty half-trench to form the gate 320 as well as word line conductor 324 of the DRAM device and a gate for the support circuitry (not shown). The remaining process steps for the fourth exemplary process are similar to those described above with regard to FIG. 4Q to manufacture a device shown in FIG. 3.

As will be understood by persons skilled in the art, the foregoing embodiments of the present invention are illustrative of the present invention rather than limiting the present invention. Having described the invention in connection with preferred/exemplary embodiments, modifications will now suggest itself to those skilled in the art. Thus, the invention is not to be limited to these embodiments/examples, but rather the invention is intended to cover various modifications and similar arrangements included within the spirit and scope of the appended claims, the scope of which should be accorded the broadest interpretation so as to encompass all such modifications and similar structures.

What is claimed is:

1. A memory device, comprising:
    a substrate having a trench, the trench having a lower portion and a side wall;
    a signal storage node including a refractory metallic storage node conductor disposed in the lower portion of the trench, a doped polycrystalline silicon disposed on the node conductor, a node dielectric, and a collar oxide disposed above the node dielectric, the metallic storage node conductor being isolated from the side wall by the node dielectric;
    a buried strap coupled to the doped polycrystalline silicon and contacting a portion of the side wall of the trench above the collar oxide;
    a trench-top dielectric having a trench-top dielectric thickness formed upon the buried strap; and
    a signal transfer device including:
        a first diffusion region extending into the substrate adjacent the portion of the trench side wall contacted by the buried strap,
        a gate insulator having a gate insulator thickness formed on the trench side wall above the buried strap, wherein the gate insulator thickness is less than the trench-top dielectric thickness, and
        a gate conductor formed within the trench upon the trench-top dielectric and adjacent the gate insulator.

2. The memory device as claimed in claim 1, wherein said refractory metallic storage node conductor fills the lower portion of the trench.

3. The memory device as claimed in claim 1, wherein said refractory metallic storage node conductor comprises tungsten.

4. The memory device as claimed in claim 1, wherein said refractory metallic storage node conductor comprises TiN.

5. The memory device as claimed in claim 4, wherein the trench has a top and the device further comprises a trench insulator formed in the trench extending from the top of the trench down through a portion of the collar oxide and extending around the circumference of the trench exclusive of the fragment of the trench contacted by the buried strap.

6. The memory device as claimed in claim 1, wherein said refractory storage node conductor comprises WN.

7. The memory device as claimed in claim 1, wherein a ratio of the trench-top dielectric thickness to the gate insulator thickness ranges between 3:1 and 12:1.

8. The memory device as claimed in claim 1, wherein the trench has an aspect ratio of greater than 50.

9. The memory device as claimed in claim 1, wherein the trench has a circumference and the buried strap contacts the side wall of the trench along a fragment of the trench circumference.

10. The memory device as claimed in claimed 9, wherein a ratio of the trench-top dielectric thickness to the gate insulator thickness ranges between 3:1 and 12:1.

11. The memory device as claimed in claim 1, wherein the device has a signal storage node leakage current less than $10^{-17}$ amperes.

* * * * *